(12) United States Patent
Baek et al.

(10) Patent No.: US 12,389,540 B2
(45) Date of Patent: Aug. 12, 2025

(54) ANTENNA MODULE AND ELECTRONIC DEVICE INCLUDING SAME

(71) Applicant: Samsung Electronics Co., Ltd., Suwon-si (KR)

(72) Inventors: Kwanghyun Baek, Suwon-si (KR); Youngsub Kim, Suwon-si (KR); Jinhoon Kim, Suwon-si (KR); Chunmyung Park, Suwon-si (KR); Youngju Lee, Suwon-si (KR); Juneseok Lee, Suwon-si (KR); Wangi Cha, Suwon-si (KR); Dohyuk Ha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 116 days.

(21) Appl. No.: 18/164,184

(22) Filed: Feb. 3, 2023

(65) Prior Publication Data
US 2023/0187833 A1 Jun. 15, 2023

Related U.S. Application Data

(63) Continuation of application No. PCT/KR2022/007355, filed on May 24, 2022.

(30) Foreign Application Priority Data

May 24, 2021 (KR) .................. 10-2021-0066535

(51) Int. Cl.
 *H01Q 1/24* (2006.01)
 *H01Q 5/42* (2015.01)
 (Continued)

(52) U.S. Cl.
 CPC ............. *H05K 1/141* (2013.01); *H01Q 1/246* (2013.01); *H01Q 5/42* (2015.01); *H01Q 9/0414* (2013.01);
 (Continued)

(58) Field of Classification Search
 CPC ........................... H01Q 1/246; H01Q 9/0414
 See application file for complete search history.

(56) References Cited

U.S. PATENT DOCUMENTS

| 10,594,019 B2 | 3/2020 | Baks et al. |
| 10,700,410 B2 | 6/2020 | Lu et al. |

(Continued)

FOREIGN PATENT DOCUMENTS

| CN | 109950682 A | 6/2019 |
| JP | 2011-097526 A | 5/2011 |

(Continued)

OTHER PUBLICATIONS

Bisognin Aimeric et al., Ball Grid Array Module With Integrated Shaped Lens for 5G Backhaul/Fronthaul Communications in F-Band, Dec. 1, 2017, IEEE Transactions on Antennas and Propagation vol. 65, No. 12, XP011673535.

(Continued)

*Primary Examiner* — Daniel Munoz
(74) *Attorney, Agent, or Firm* — Jefferson IP Law, LLP

(57) ABSTRACT

An electronic device is provided. The electronic device includes multiple antenna arrays, multiple first printed circuit board (PCB) sets corresponding to the multiple antenna arrays, a second PCB including a power interface, and a grid array configured to couple a first surface of each of first PCBs of the first PCB sets corresponding to an antenna array and a first surface of the second PCB, wherein the size of the first PCB is smaller than that of the second PCB, and a feeding line configured to transfer a signal to an antenna element is formed on at least one of a layer corresponding to the first surface of each of the first PCBs or a layer corresponding to the first surface of the second PCB.

20 Claims, 17 Drawing Sheets

(51) Int. Cl.
  *H01Q 9/04*   (2006.01)
  *H01Q 21/00*  (2006.01)
  *H01Q 21/06*  (2006.01)
  *H05K 1/14*   (2006.01)
  *H05K 1/02*   (2006.01)

(52) U.S. Cl.
  CPC ....... *H01Q 21/0025* (2013.01); *H01Q 21/065* (2013.01); *H05K 1/0237* (2013.01); *H05K 2201/10098* (2013.01); *H05K 2201/10734* (2013.01)

(56) References Cited

U.S. PATENT DOCUMENTS

| | | | |
|---|---|---|---|
| 11,005,155 | B2 | 5/2021 | Khan et al. |
| 11,309,621 | B2 | 4/2022 | Baek et al. |
| 2014/0070999 | A1 | 3/2014 | Kaneda et al. |
| 2016/0093939 | A1 | 3/2016 | Kim et al. |
| 2016/0352023 | A1 | 12/2016 | Dang et al. |
| 2017/0084971 | A1 | 3/2017 | Kildal et al. |
| 2017/0125895 | A1 | 5/2017 | Baks et al. |
| 2018/0358685 | A1 | 12/2018 | Han et al. |
| 2020/0091581 | A1 | 3/2020 | Ou et al. |
| 2020/0161766 | A1* | 5/2020 | Liu ........................ H01Q 9/045 |
| 2020/0303822 | A1* | 9/2020 | Yao .................. H01L 23/49816 |
| 2020/0315001 | A1 | 10/2020 | Khan et al. |
| 2021/0075088 | A1 | 3/2021 | Edwards et al. |
| 2021/0242568 | A1 | 8/2021 | Zhang et al. |
| 2021/0320399 | A1* | 10/2021 | Bisiules ................ H01Q 21/24 |
| 2021/0384615 | A1* | 12/2021 | Jia ........................ H01Q 21/065 |

FOREIGN PATENT DOCUMENTS

| | | |
|---|---|---|
| JP | 2018-093491 A | 6/2018 |
| KR | 10-0859319 B1 | 9/2008 |
| KR | 10-2020-0120352 A | 10/2020 |
| KR | 10-2021-0011484 A | 2/2021 |
| KR | 10-2021-0044640 A | 4/2021 |

OTHER PUBLICATIONS

European Search Report dated Jul. 12, 2024, issued in European Application No. 22811611.7.
International Search Report dated Sep. 2, 2022, issued in International Patent Application No. PCT/KR2022/007355.
Korean Office Action dated Jun. 26, 2025, issued in Korean Patent Application No. 10-2021-0066535.

* cited by examiner

260

261

263

265

267

270

ANTENNA MODULE AND ELECTRONIC DEVICE INCLUDING SAME

CROSS-REFERENCE TO RELATED APPLICATION(S)

This application is a continuation application, claiming priority under § 365(c), of an International application No. PCT/KR2022/007355, filed on May 24, 2022, which is based on and claims the benefit of a Korean patent application number 10-2021-0066535, filed on May 24, 2021, in the Korean Intellectual Property Office, the disclosure of which is incorporated by reference herein in its entirety.

TECHNICAL FIELD

The disclosure relates to a wireless communication system. More particularly, the disclosure relates to an antenna module and an electronic device including the same in a wireless communication system.

BACKGROUND ART

To meet the demand for wireless data traffic having increased since deployment of $4^{th}$ generation (4G) communication systems, efforts have been made to develop an improved 5th generation (5G) or pre-5G communication system. Therefore, the 5G or pre-5G communication system is also called a 'Beyond 4G Network' or a 'Post Long Term Evolution (LTE) System'.

The 5G communication system is considered to be implemented in higher frequency (millimeter wave (mmWave)) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, coordinated multi-points (CoMP), reception-end interference cancellation and the like.

In the 5G system, Hybrid frequency shift keying (FSK) and quadrature amplitude modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

Products equipped with multiple antennas to improve communication performance have been developed, and equipment having a gradually increasing number of antennas is expected to be used. As communication devices have increased a number of elements, there are increasing demands for an antenna structure for reducing loss during signal transmission in order to improve the performance of antenna equipment.

The above information is presented as background information only to assist with an understanding of the disclosure. No determination has been made, and no assertion is made, as to whether any of the above might be applicable as prior art with regard to the disclosure.

DISCLOSURE

Technical Problem

Aspects of the disclosure are to address at least the above-mentioned problems and/or disadvantages and to provide at least the advantages described below. Accordingly, an aspect of the disclosure is to provide an antenna module having an antenna board and a main board coupled through a grid array, and an electronic device including the same, in a wireless communication system.

Another aspect of the disclosure is to provide an antenna module having a feeding line disposed on the bottom layer of an antenna board or on the top layer of a main board, and an electronic device including the same, in a wireless communication system.

Another aspect of the disclosure is to provide an antenna module having a feeding line disposed, for each antenna element, on an air layer formed through a grid array, and an electronic device including the same, in a wireless communication system.

Additional aspects will be set forth in part in the description which follows and, in part, will be apparent from the description, or may be learned by practice of the presented embodiments.

Technical Solution

In accordance with an aspect of the disclosure, a radio unit (RU) module is provided. The RU module includes multiple antennas, a first printed circuit board (PCB) on which the multiple antennas are arranged, a second PCB including a power interface, and a grid array configured to couple a first surface of the first PCB and a first surface of the second PCB, wherein the size of the first PCB is smaller than that of the second PCB, and a feeding line configured to transfer a signal to at least one antenna among the multiple antennas is formed on at least one of a layer corresponding to the first surface of the first PCB or a layer corresponding to the first surface of the second PCB.

In accordance with another aspect of the disclosure, an electronic device is provided. The electronic device includes multiple antenna arrays, multiple first printed circuit board (PCB) sets corresponding to the multiple antenna arrays, a second PCB including a power interface, and a grid array configured to couple a first surface of each of first PCBs of the first PCB sets corresponding to an antenna array and a first surface of the second PCB, wherein the size of each of the first PCBs is smaller than that of the second PCB, and a feeding line configured to transfer a signal to an antenna element is formed on at least one of a layer corresponding to the first surface of each of the first PCBs or a layer corresponding to the first surface of the second PCB.

Advantageous Effects

A device and a method according to various embodiments of the disclosure may provide a higher antenna performance by directly connecting an antenna board and a main board and positioning a feeding line closer to the antenna board.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms used in the disclosure are only used to describe specific embodiments, and are not intended to limit the disclosure. A singular expression may include a plural expression unless they are definitely different in a context. Unless defined otherwise, all terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

Hereinafter, various embodiments of the disclosure will be described based on an approach of hardware. However, various embodiments of the disclosure include a technology that uses both hardware and software, and thus the various embodiments of the disclosure may not exclude the perspective of software.

Figure 1:
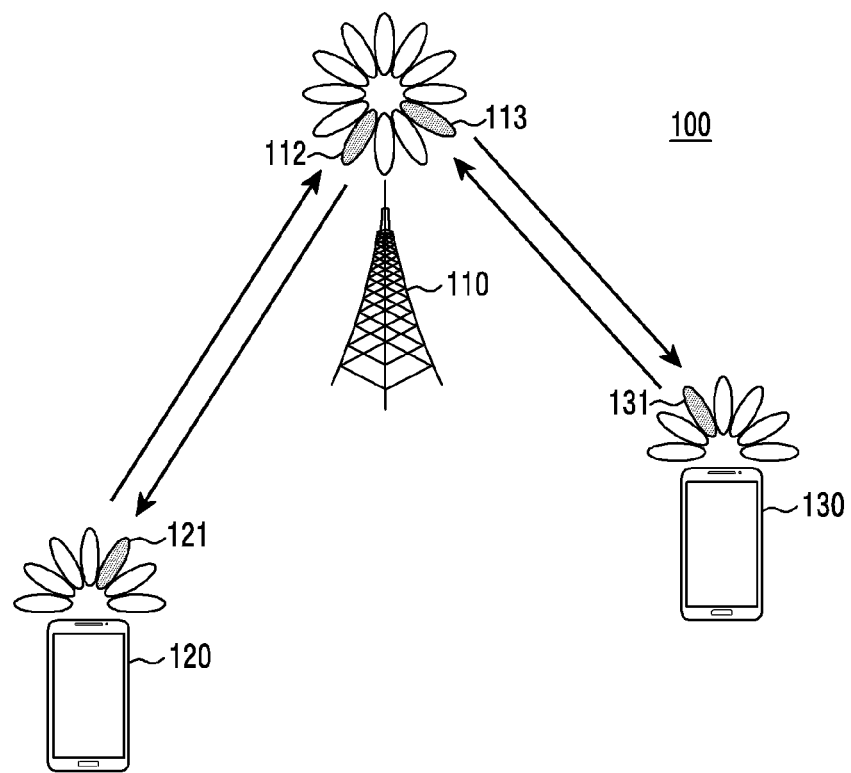
FIG. 1 shows a wireless communication system according to an embodiment of the disclosure.

FIG. 1 shows a wireless communication system according to an embodiment of the disclosure.

Referring to FIG. 1, a wireless communication environment 100 is an example of a base station 110 and a terminal 120 as parts of a node using a wireless channel.

The base station 110 corresponds to a network infrastructure for providing wireless access to the terminal 120. The base station 110 has a coverage defined as a predetermined geographic area based on a distance in which a signal may be transmitted. The base station 110 may be referred to as a massive multiple input multiple output (MIMO) unit (MMU), "an access point (AP)", "an eNodeB (eNB)", "a 5th generation node", "a 5G NodeB (NB)", "a wireless point", "a transmission/reception point (TRP)", "an access unit", "a distributed unit (DU)", "a transmission/reception point (TRP)", "a radio unit (RU)", a remote radio head (RRH), or other names having a technical meaning equivalent thereto, in addition to a base station. The base station 110 may transmit a downlink signal or receive an uplink signal.

The terminal 120 is a device used by a user and performs communication with the base station through a wireless channel. In some cases, the terminal 120 may be operated without involvement of a user. That is, the terminal 120 may be a device for performing machine type communication (MTC) and not carried by a user. The terminal 120 may be referred to as "a user equipment (UE)", "a mobile station", "a subscriber station", "a customer-premises equipment (CPE)", "a remote terminal", "a wireless terminal", "an electronic device", "a vehicle terminal", "a user device", or another term having a technical meaning equivalent thereto, in addition to a terminal.

The terminal 120 and the terminal 130 shown in FIG. 1 may support vehicle communication. In a case of vehicle communication, the standardization of vehicle-to-everything (V2X) technology has been completed in 3rd generation partnership project (3GPP) release 14 and release 15 based on a device-to-device (D2D) communication structure in an LTE system, and efforts are currently underway to develop a V2X technology based on 5G new radio (NR). The NR V2X supports broadcast communication, groupcast (or multicast) communication, and unicast communication between terminals.

The base station 110 and the terminals 120, 130 may select serving beams 112, 113, 121, 131 through a beam search or beam management procedure.

A beamforming technology is used as one of technologies for reducing a propagation path loss and increasing a radio propagation distance. Generally, beamforming uses multiple antennas to concentrate the arrival area of radio waves, or increase the directivity of reception sensitivity in a specific direction. Therefore, communication equipment may include multiple antennas to form a beamforming coverage instead of forming a signal in an isotropic pattern by using a single antenna. Hereinafter, an antenna array including multiple antennas will be described.

The base station 110 or the terminal 120 may include an antenna array. Each antenna included in an antenna array may be referred to as an array element or an antenna element. Hereinafter, an antenna array is described as a two-dimensional planar array in the disclosure, but this is merely an embodiment and does not limit other embodiments of the disclosure. An antenna array may be configured in various forms such as a linear array or a multi-layer array. An antenna array may be referred to as a massive antenna array.

A main technology to improve the data capacity of 5G communication is a beamforming technology using an antenna array connected to multiple RF paths. The number of components for performing wireless communication has been increased to improve communication performance. Particularly, the number of antennas, RF parts (for example, an amplifier and a filter) for processing an RF signal received or transmitted through an antenna, and components has been increased and thus in view of configuring communication equipment, a spatial gain and cost efficiency are essentially required in configuring a communication device in addition to satisfying communication performance.

Figure 2A:
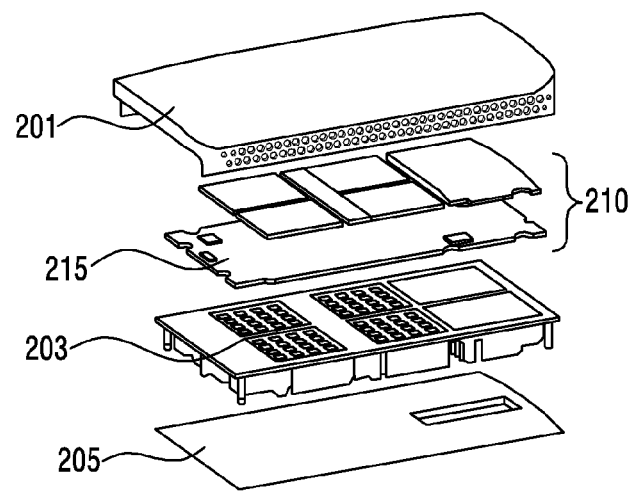
FIGS. 2A and 2B show an example of components of an electronic device according to various embodiments of the disclosure.
Figure 2A:
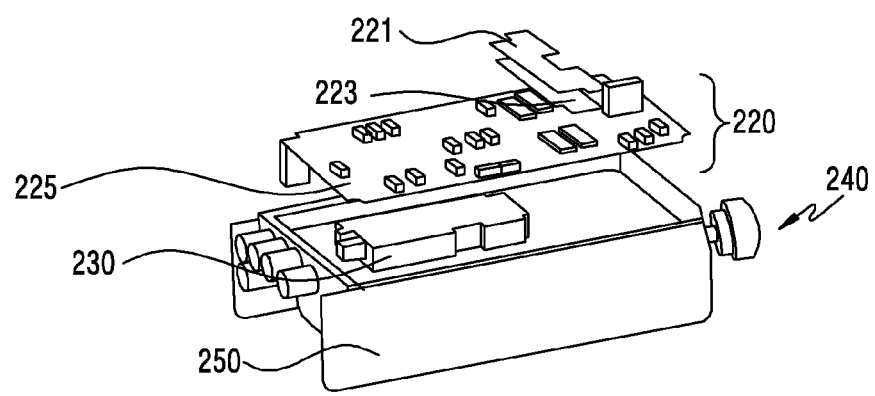
Figure 2B:
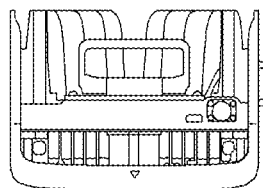
Figure 2B:
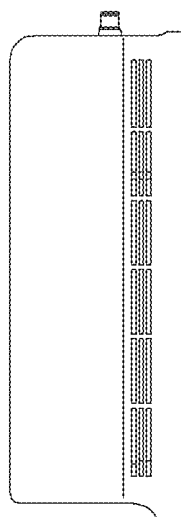
Figure 2B:
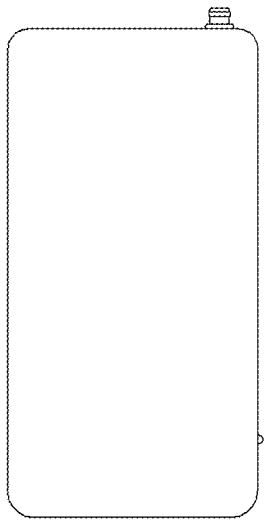
Figure 2B:
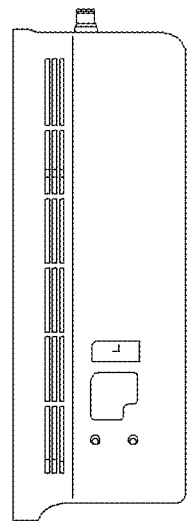
Figure 2B:
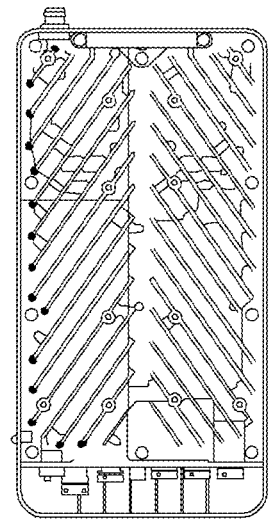
Figure 2B:
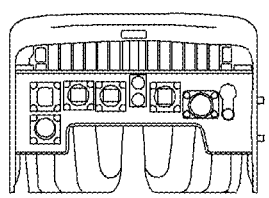

FIGS. 2A and 2B show an example of components of an electronic device according to various embodiments of the disclosure. FIG. 2A shows internal components constituting an electronic device and FIG. 2B shows an upper surface, a lower surface, and a lateral surface of an electronic device.

Referring to FIG. 2A, the electronic device may include a radome cover 201, an RU housing 203, a DU cover 205 and an RU 210. The RU 210 may include an antenna module and RF components for the antenna module. The RU 210 may include an antenna module having an air-based feed structure according to embodiments of the disclosure to be described below. According to an embodiment, the antenna module may include a ball grid array (BGA) module antenna. The RU 210 may include an RU board 215 to which RF components are mounted.

The electronic device may include a DU 220. The DU 220 may include an interface board 221, a modem board 223, and a CPU board 225. The electronic device may include a power module 230, a GPS 240, and a DU housing 250.

Referring to FIG. 2B, a drawing 260 of the electronic device viewed from the top. A drawing 261, drawing 263, drawing 265, and drawing 267 show figures of the electronic device viewed from the left, front, right, and rear side, respectively. Drawing 270 shows the electronic device viewed from the below.

Figure 3A:
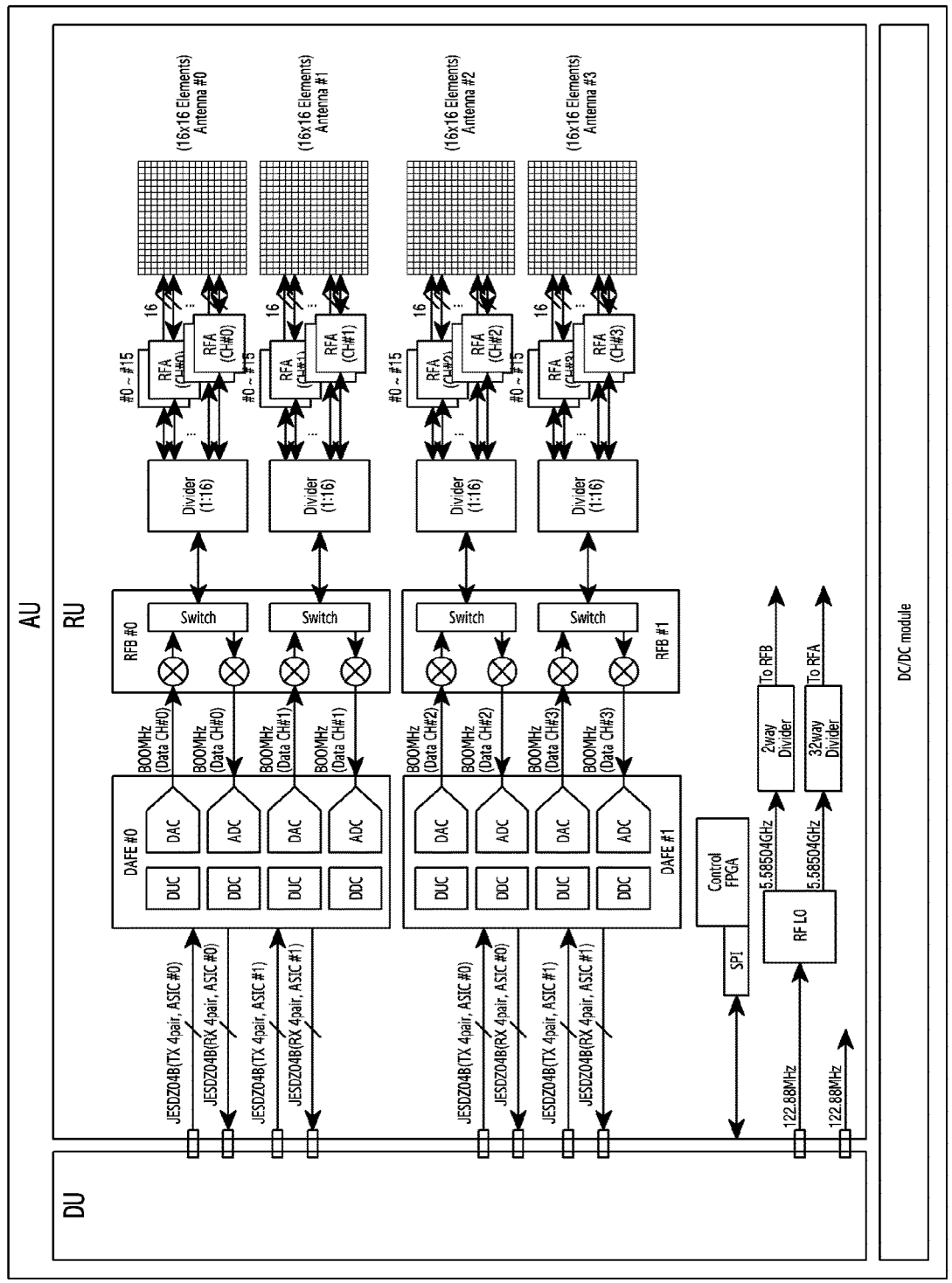
FIGS. 3A and 3B show an example of functional configuration of an electronic device according to various embodiments of the disclosure.
Figure 3B:
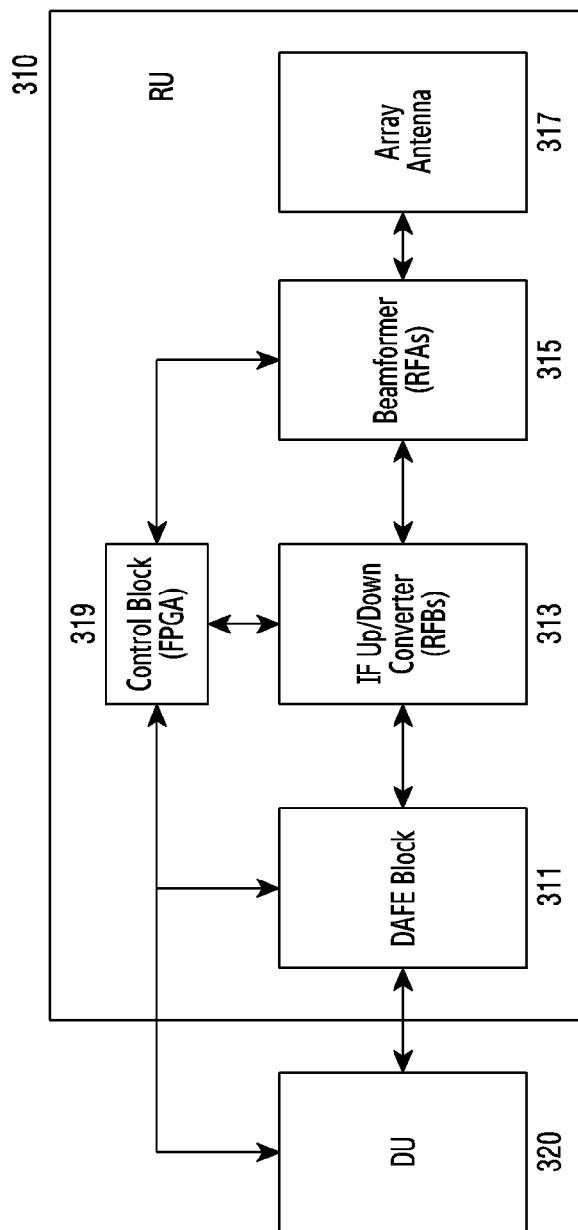

FIGS. 3A and 3B show an example of functional configuration of an electronic device according to various embodiments of the disclosure. The electronic device may include an access unit. The access unit may include an RU 310, a DU 320, and a DC/DC module. The RU 310 according to embodiments of the disclosure may mean an assembly to which antennas and RF components are mounted. The DU 320 according to embodiments of the disclosure may be configured to process a digital wireless signal, and decode a digital wireless signal to be transmitted to the RU 310 or decrypt a digital wireless signal received from the RU 310.

The DU 320 may be configured to perform communication with an upper node (e.g., a centralized unit (CU)) or a core met (e.g., 5GC and EPC).

Referring to FIG. 3A, the RU 310 may include multiple antenna elements. The RU 310 may include at least one array antenna. According to another embodiment, the array antenna may be formed of a planar antenna array. The array antenna may correspond to one stream. The array antenna may include multiple antenna elements corresponding to one transmission path (or reception path). By way of example, the array antenna may include 256 antenna elements having 16×16 form.

The RU 310 may include RF chains for processing a signal of each array antenna. The RF chains may be referred to as "RFA". The RFA may include a mixer and RF components (for example, a phase transformer and a power amplifier) for beamforming. The mixer of the RFA may be configured to down-convert an RF signal of an RF frequency into an intermediate frequency, or up-convert an intermediate frequency into a signal of an RF frequency. According to yet another embodiment, one set of RF chains may correspond to one array antenna. By way of example, the RU 310 may include four RF chain sets for four array antennas. Multiple RF chains may be connected to a transmission path or a reception path through a divider (for example, 1:16). Although not shown in FIG. 3A, according to yet another embodiment, the RF chains may be implemented as a radio frequency integrated circuit (RFIC). The RFIC may process and generate RF signals provided to multiple antenna elements.

The RU 310 may include a digital analog front end (DAFE) and "RFB." The DAFE may be configured to perform interconversion between a digital signal and an analog signal. By way of example, the RU 310 may include two DAFEs (DAFE #0 and DAFE #1). The DAFE may be configured to up-convert a digital signal (i.e., DUC) and convert the up-converted signal into an analog signal (i.e., DAC) in a transmission path. The DAFE may be configured to convert an analog signal into a digital signal (i.e., ADC) and down-convert a digital signal (i.e., DDC) in a reception path. The RFB may include a mixer and a switch corresponding to a transmission path and a reception path. The mixer of the RFB may be configured to up-convert a baseband frequency into an intermediate frequency, or down-convert a signal of an intermediate frequency into a signal of a baseband frequency. The switch may be configured to select one of a transmission path and a reception path. By way of example, the RU 310 may include two RFBs (RFB #0 and RFB #1).

The RU 310 as a controller may include a field programmable gate array (FPGA). The FPGA means a semiconductor including a designable logic element and a programmable internal circuit. Communication with the DU 320 may be performed through Serial Peripheral Interface (SPI) communication.

The RU 310 may include a local oscillator (RF LO). The RF LO may be configured to provide a reference frequency for up-conversion or down-conversion. According to yet another embodiment, the RF LO may be configured to provide a frequency for up-conversion or down-conversion of the RFB described above. For example, the RF LO may provide a reference frequency to RFB #0 and RFB #1 through a 2-way divider.

According to yet another embodiment, the RF LO may be configured to provide a frequency for up-conversion or down-conversion of the RFA described above. For example, the RF LO may provide a reference frequency to each RFA (eight per RF chain for each polarization group) through a 32-way divider.

Referring to FIG. 3B, the RU 310 may include a DAFE block 311, an IF up/down converter 313, a beamformer 315, an array antenna 317, and a control block 319. The DAFE block 311 may convert a digital signal into an analog signal or an analog signal into a digital signal. The IF up/down converter 313 may correspond to the RFB. The IF up/down converter 313 may convert a signal of a baseband frequency into a signal of an IF frequency, or a signal of an IF frequency into a signal of a baseband frequency based on the reference frequency provided from the RF LO. The beamformer 315 may correspond to the RFA. The beamformer 315 may convert a signal of an RF frequency into a signal of an IF frequency, or a signal of an IF frequency into a signal of an RF frequency based on the reference frequency provided from the RF LO. The array antenna 317 may include multiple antenna elements. Each antenna element of the array antenna 317 may be configured to radiate a signal processed through the RFA. The array antenna 317 may be configured to perform beamforming according to a phase applied by the RFA. The control block 319 may control each block of the RU 310 to perform a command from the DU 320 and the signal processing described above.

Although the base station was described as an example of the electronic device in FIGS. 2A, 2B, 3A, and 3B, the embodiments of the disclosure are not limited to the base station. Embodiments of the disclosure may be applied to any electronic device for radiating a wireless signal in addition to a base station including a DU and an RU.

As technology advances, while improving transmission output, securing equivalent reception performance and supporting a dual band (for example, 28 GHz band and 39 GHz band) are also required. In order to meet the requirement and reduce costs of an RFIC package, a TR/RX switch (for example, a SPDT switch) may be used. The addition of switch may cause insertion loss increment. For example, based on the same antenna array, deterioration of Tx performance by about 4 dB and Rx performance by about 3.6 dB may be problematically caused. Compensation measures are required for about 1 dB loss as the insertion loss of each band (for example, 28 GHz band and 39 GHz band). Furthermore, additional compensation measures are also required for the increase of the number of elements and interval between elements. To satisfy the above-described specifications, embodiments of the disclosure provide an antenna module for remedying a feeding loss of an antenna and an electronic device including the antenna module. The embodiments of the disclosure suggest an antenna module having an arrangement structure for reducing manufacturing costs and achieving a low loss and an electronic device including the antenna module.

The embodiments of the disclosure suggest an antenna structure for concurrently supporting a dual band and providing high transmission performance by reducing feeding losses for each band and an electronic device including the antenna structure. In addition, the embodiments of the disclosure suggest an antenna structure for improving mass production reliability when manufactured, through arrangement of a grid array durable in terms of bending property, and an electronic device including the antenna structure.

Figure 4:
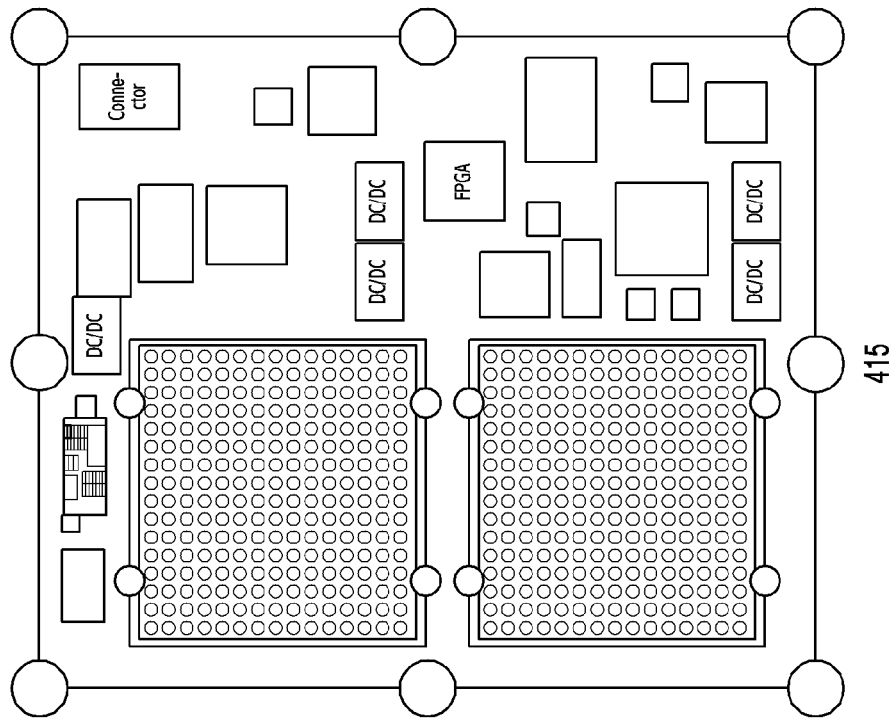
FIG. 4 shows an example of a radio unit (RU) board of an electronic device according to an embodiment of the disclosure.
Figure 4:
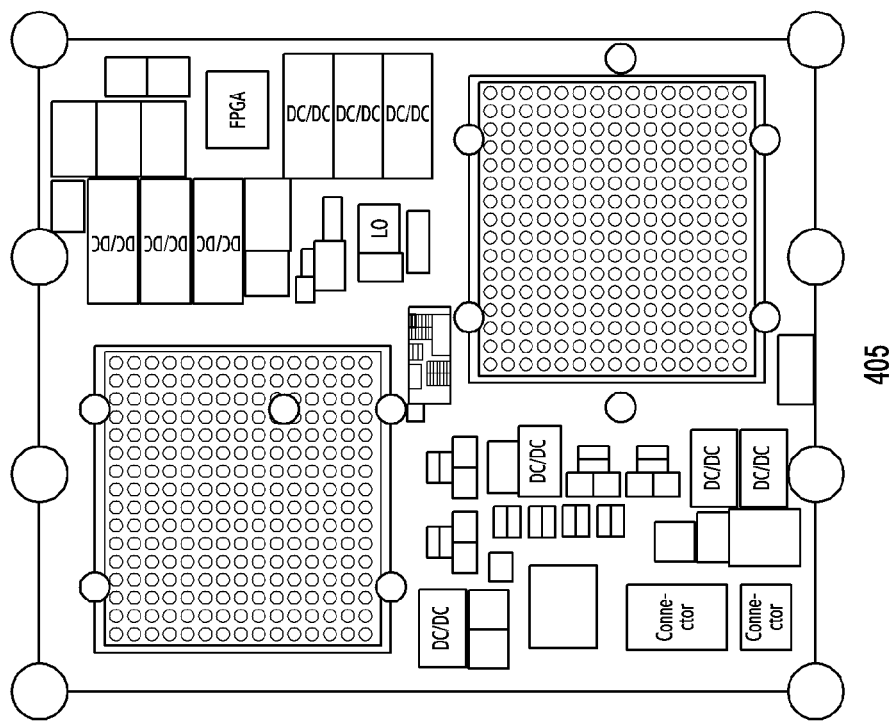

FIG. 4 shows an example of a radio unit (RU) board of an electronic device according to an embodiment of the disclosure. The electronic device amounts to a structure including a separate arrangement of a PCB (hereinafter, a first PCB) to which an antenna is mounted and a PCB (hereinafter, a second PCB) to which antenna arrays and components (for example, a connector, a direct current (DC)/DC converter, and a DFE) are mounted. The first PCB may be referred to as an antenna board, a radiation substrate, a radiation board, or an RF board. The second PCB may be referred to as an RU board, a main board, a power board, a mother board, a package board, or a filter board.

Referring to FIG. 4, the RU board may include components for transferring a signal to a radiator (for example, an antenna). According to an embodiment, one or more antenna PCBs (i.e., the first PCBs) may be mounted on the RU board. That is, one or more array antennas may be mounted on the RU board. By way of example, two array antennas may be mounted on the RU board. According to another embodiment, the array antennas may be arranged on symmetrical positions on the RU board (405). According to yet another embodiment, array antennas may be arranged on one side (for example, a left side) of the RU board and RF components to be described below may be arranged on the other side (for example, a right side) (415). Although two array antennas are shown in FIG. 4, embodiments of the disclosure are not limited thereto. Two array antennas may be arranged for each band so as to support a dual band, and the array antennas mounted on the RU board may be configured to support 2-transmit 2-receive (2T2R).

The RU board may include components for supplying an RF signal to an antenna. According to an embodiment, the RU board may include one or more DC/DC converters. The DC/DC converter may be used for converting a direct current into a direct current. According to an embodiment, the RU board may include one or more local oscillators (LO). The LO may be used for supplying a reference frequency for up-conversion or down-conversion in an RF system. According to an embodiment, the RU board may include one or more connectors. The connector may be used for transferring an electrical signal. According to an embodiment, the RU board may include one or more dividers. The divider may be used for distributing an input signal and transferring an input signal to multiple paths. According to an embodiment, the RU board may include one or more low-dropout regulators (LDOs). The LDO may be used for suppressing external noise and supplying power. According to an embodiment, the RU board may include one or more voltage regulator modules (VRMs). The VRM may mean a module for securing a proper voltage to be maintained. According to an embodiment, the RU board may include one or more digital front ends (DFEs). According to an embodiment, the RU board may include one or more radio frequency programmable gain amplifiers (FPGAs). According to an embodiment, the RU board may include one or more intermediate frequency (IF) processors. Some of components shown in FIG. 4 may be omitted or more components may be additionally mounted as the configuration shown in FIG. 4. Although not described with reference to FIG. 4, the RU board may include an RF filter for filtering a signal.

Figure 5:
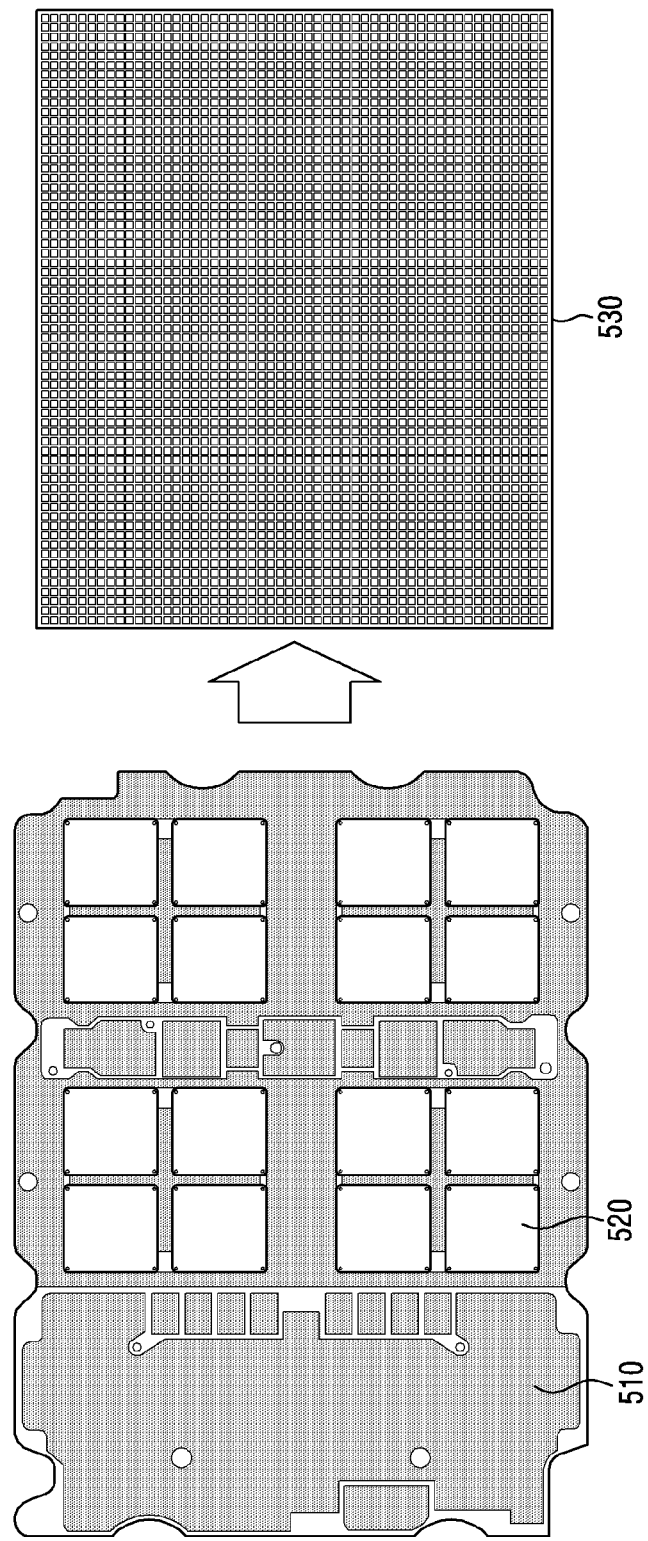
FIG. 5 shows an example of an arrangement between a RU board and an antenna unit of an electronic device according to an embodiment of the disclosure.

FIG. 5 shows an example of an arrangement between a RU board and an antenna unit of an electronic device according to an embodiment of the disclosure. The electronic device according to embodiments of the disclosure may include a modular-type antenna. As the number of antenna elements mounted to the electronic device increases for a mmWave frequency band, assembly process and mass production reliability in a production process have a significant impact of performance.

An integrated connecting structure through lamination has a problem in that it is difficult to secure high reliability and stable performance as the weight increases. In addition, this structure has a disadvantage in mass production due to complicated supply chain management (SCM). Therefore, there is demand for a function connection structure suitable for mass production and robust for assembly intervals. Embodiments of the disclosure suggest a scheme for connecting an antenna and a RU board (i.e., the second PCB) through direct interconnection not coupling feeding. A grid array may be used for direct interconnection.

Referring to FIG. 5, embodiments of the disclosure suggest a connecting structure which secures reliability to enhance design freedom and performance as well as have an advantage in terms of a price by modularizing a grid array (for example, a BGA). A board (hereinafter, an antenna board) on which antenna elements are mounted will be described by referring to one antenna unit in the disclosure for explain the modularized grid array. That is, multiple antenna elements may be mounted on the antenna board and the multiple antenna elements mounted on the antenna board may be referred to as one antenna unit. For example, assuming 8×8 arrangement shown in FIG. 9, one unit may include 64 antenna elements.

The RU board 510 may include 16 antenna units. The antenna unit 520 may include 64 antenna elements. In a case of the example shown in FIG. 5, four antenna units may correspond to one array antenna and correspond to 1-transmit 1-receive (1T1R). The RU board may include an array structure of 4T4R. According to an embodiment of the disclosure, the RU board may include a grid array module 530 corresponding to an antenna unit for each antenna board. Although not shown in FIG. 5, each antenna board may be coupled to one grid array module 530 (for example, the BGA module). The grid array module 530 may be coupled to the RU board corresponding to the main PCB.

Figure 6:
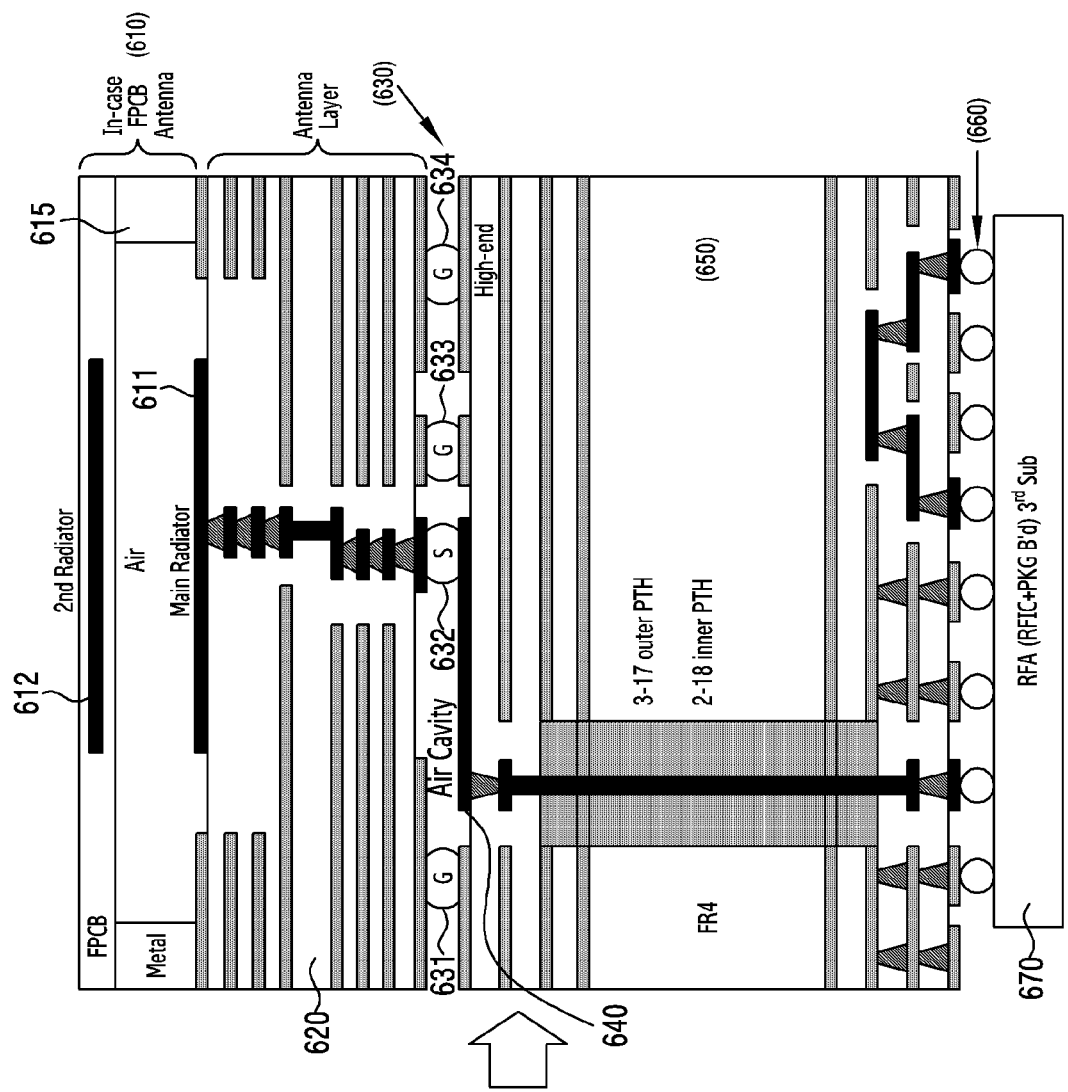
FIG. 6 shows an example of a stacking structure of an electronic device including an air-based feed structure according to an embodiment of the disclosure.
Figure 6:
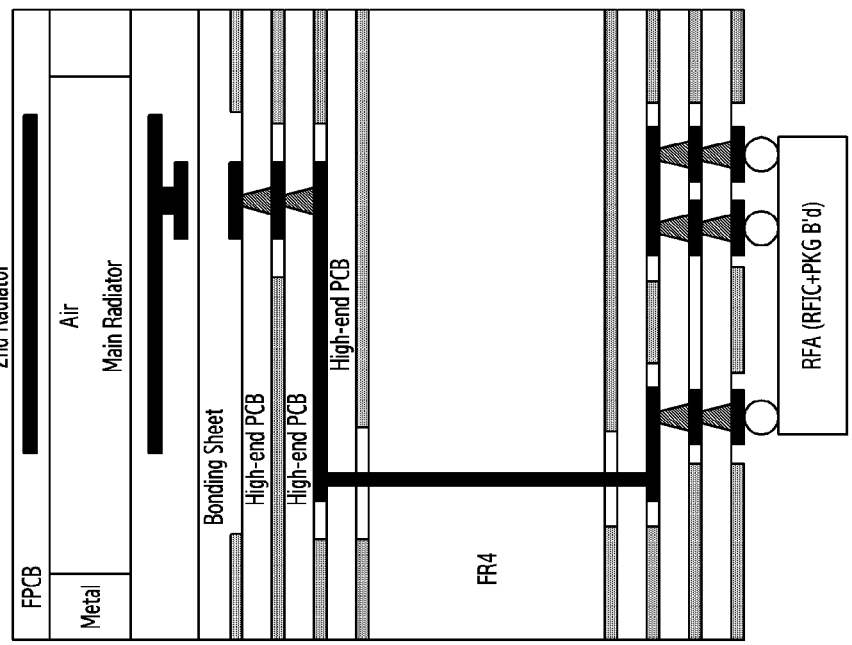

FIG. 6 shows an example of a stacking structure of an electronic device including an air-based feed structure according to an embodiment of the disclosure. As described above with reference to FIG. 5, coupling bonding configured by lamination or a bonding sheet has a problem that the coupling boding is not enough to provide mass production reliability and high performance. Hereinafter, through FIG. 6, a scheme for connecting an antenna and an RU board through direct interconnection not coupling feeding will be suggested.

Referring to FIG. 6, the electronic device may include an antenna part 610. According to an embodiment, the antenna part 610 may be an in-case FPCB antenna. The antenna part 610 may include a main radiator 611 and a second radiator 612 formed on a cover. The antenna part 610 may include a metal column 615 for supporting the cover. The in-case FPCB shown in FIG. 6 is merely an embodiment and is not construed to delimit other embodiments of the disclosure. That is, the antenna part of the electronic device according to embodiments of the disclosure may include only the main radiator 611.

The electronic device may include an antenna board. The antenna board may be a PCB to which antenna elements are mounted and referred to as a first PCB 620. The first PCB 620 may include multiple layers. The main radiator 611 may be disposed on the uppermost layer (i.e., a first layer) of the first PCB 620. Unlike the cross-sectional view shown in FIG. 6, not only one antenna element (for example, the main radiator 611) but also multiple antenna elements may be mounted on the first layer of the first PCB 620 according to embodiments of the disclosure. The multiple antenna elements may be referred to as an antenna unit as mentioned with reference to FIG. 4. The first PCB 620 may include feeding layers configured to transfer a signal through the multiple layers.

A connecting unit such as a grid array may be disposed between the first PCB 620 and the second PCB 650. A signal may be transferred through direct contact. "G" corresponds to a ground path and "S" corresponds to a signal path. According to embodiments of the disclosure, the first PCB 620 may be coupled to the grid array 630. According to an embodiment, the grid array 630 may be a BGA. The grid array 630 (i.e., BGA) may be coupled to the first PCB 620. The grid array 630 (i.e., BGA) may include multiple balls 631, 632, 633, and 634. Some (for example, a ball 631, a ball 633, and a ball 634) of the multiple balls may be configured to be coupled to the first PCB and the second PCB (i.e., corresponding to the RU board). The corresponding balls may function as a ground path. Some (for example, a ball 632) of the multiple balls may be configured to function as a signal line for transferring an RF signal between the first PCB 620 and the second PCB 650 which is the RU board.

There is an interval between the first PCB 620 and the second PCB 650 due to the volumes of the balls. An air layer may be formed between the grid arrays. An air cavity is formed between balls due to the interval between the first PCB 620 and the second PCB 650. There is no dielectric loss due to the air cavity. That is, according to embodiments of the disclosure, a feeding line is not formed in the second PCB but formed in not only a position adjacent to the antenna board but also the air layer, thus reducing a feeding loss. Hereinafter, in the disclosure, the arrangement structure in which a feeding line is formed in the air layer may be referred to as an air-based feed structure. The BGA may function as a shielding of a feeding line.

According to another embodiment of the disclosure, the feeding line 640 may be formed on the uppermost layer of the second PCB 650. The feeding line 640 may be electrically connected to the first PCB 620 through a contact element (for example, the ball 632) of the grid array. However, unlike what is shown in FIG. 6, the feeding line may be formed on the first PCB 620 which is the antenna board according to an embodiment. The feeding line may be formed under the lowermost surface of the first PCB 620. The feeding line may be electrically connected to the second PCB 650 through a contact element (for example, a ball) of the grid array. In addition, according to yet another embodiment, some feeding lines may be formed on the lowermost layer of the first PCB 620 and some other feeding lines may be formed on the uppermost layer of the second PCB 650. The feeding line formed on the second PCB 650 and the feeding line formed on the first PCB 620 may be electrically connected to each other through a contact element (for example, a ball) of the grid array.

The second PCB 650 may be connected to the RFA 670 through the grid array 660. The RFA 670 may include multiple components for processing an RF signal. The RFA 670 may be implemented as a package board on which an RFIC is disposed. The multiple components for processing an RF signal may correspond to components for beamforming and include a phase converter, a power amplifier, and a mixer. The RFIC may include multiple RF chains to process multiple signals corresponding to each antenna board. Each RF chain may include components corresponding to at least one antenna element. The RFA 670 may be referred to as a third PCB as package board.

However, unlike what is shown in FIG. 6, according to an embodiment, the RFIC may not be positioned in the package board but disposed on another surface of the package board.

That is, one surface of the third PCB may be coupled to the second PCB 650 through the grid array and the other surface of the third PCB may be coupled to the RFIC. For feeding the RFIC, the air-based feed structure according to embodiments of the disclosure may be used. A specific example will be described with reference to FIGS. 10D and 10E.

FIG. 6 shows the ball grid array (BGA) as an example of a grid array which is a connecting unit, but embodiments of the disclosure are not limited thereto. In addition to the BGA, various types of connecting units such as a land grid array (LGA) and a pin grid array (PGA) may be used.

Figure 7:
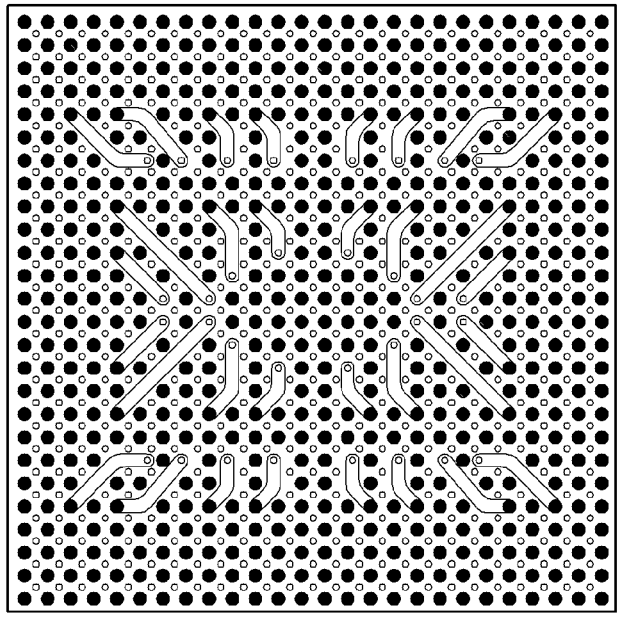
FIG. 7 shows an example of an arrangement of a feeding wire according to an air-based feed structure according to an embodiment of the disclosure.
Figure 7:
Figure 7:
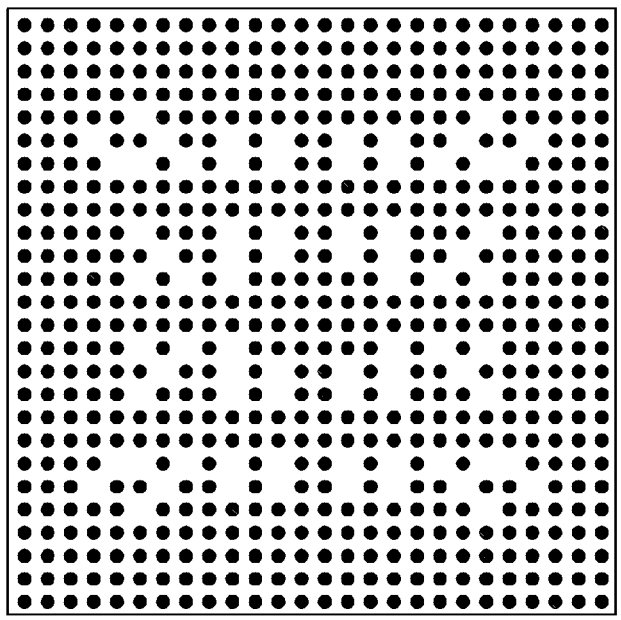

FIG. 7 shows an example of an arrangement of a feeding wire according to an air-based feed structure according to an embodiment of the disclosure.

The air-based feed structure may include at least one feeding line formed between the RU board and the antenna board. According to embodiments of the disclosure, the uppermost layer of the RU board and the lowermost layer of the antenna board may be coupled through the grid array. An air layer may be formed on a portion other than the grid array due to the volume of the grid array. Reference may be made to the air-based feed structure in FIG. 6. The feeding lines according to embodiments of the disclosure may be arranged between respective elements (for example, balls) of the grid array.

Referring to FIG. 7, the cross-sectional view 710 shows a section in which the grid array is disposed. According to an embodiment, each dot may correspond to a ball configured to connect the antenna board and the RU board. A grid array arrangement corresponding to 16 antenna elements of the antenna board is assumed. Each antenna element may support two polarizations (e.g., a vertical (V) polarization and a horizontal (H) polarization).

The cross-sectional view 720 shows grid arrays and feeding lines arranged in an empty space between the grid arrays. As described above with reference to FIG. 6, the feeding lines shown in FIG. 7 may be positioned in an air cavity between the RU board and the antenna board. The feeding lines may be formed on the uppermost layer of the RU board, the lowermost layer of the antenna board, or both the uppermost layer of the RU board and the lowermost layer of the antenna board. Two feeding lines may be connected to one antenna element. That is, total 32 feeding line may be arranged based on 16 antennas. According to embodiments of the disclosure, 32 feeding lines may be arranged in an empty space of the BGA.

According to an embodiment, a pitch of a ball may have a range of 0.3-1.2 mm. The range corresponds to 0.02-0.12λ (λ is a length of a wave) in a 28 GHz band and 0.04-0.16λ in a 39 GHz band. According to an embodiment, a size of a ball may have a range of 0.2-1.0 mm. The range corresponds to 0.01-0.1λ (λ is a length of a wave) in a 28 GHz band and 0.02-0.13λ in a 39 GHz band. According to an embodiment, a diameter of a ball pad may have a range of 0.3-1.0 mm. The range corresponds to 0.02-0.1λ (λ is a length of a wave) in a 28 GHz band and 0.04-0.13λ in a 39 GHz band. A performance according to embodiments of the disclosure was derived on the assumption that a pitch of a ball is 0.8 mm, a size of a ball is 0.5 mm, and a diameter of a ball pad is 0.4 mm According to an embodiment, a size of the PCB may correspond to 43×43 mm$^2$ in a 28 GHz band. According to an embodiment, a size of the PCB may correspond to 31×31 mm$^2$ in a 39 GHz band.

Numerical limitation of the range defined in the disclosure may have a certain error (for example, 5%). The numerical limitation for a specific component, as well as the structure according to embodiments of the disclosure, may be construed as an embodiment as a result for achieving easy benefits for mass production according to reductions in feeding loss and process errors according to embodiments of the disclosure.

Although not shown in FIG. 7, for example, when three arrangements of the grid array and the feeding lines in a square shape are added (i.e., when a square antenna unit having 8×8 form is formed), one board size to which the aforementioned grid module in FIG. 5 may be attached may be formed.

Figure 8:
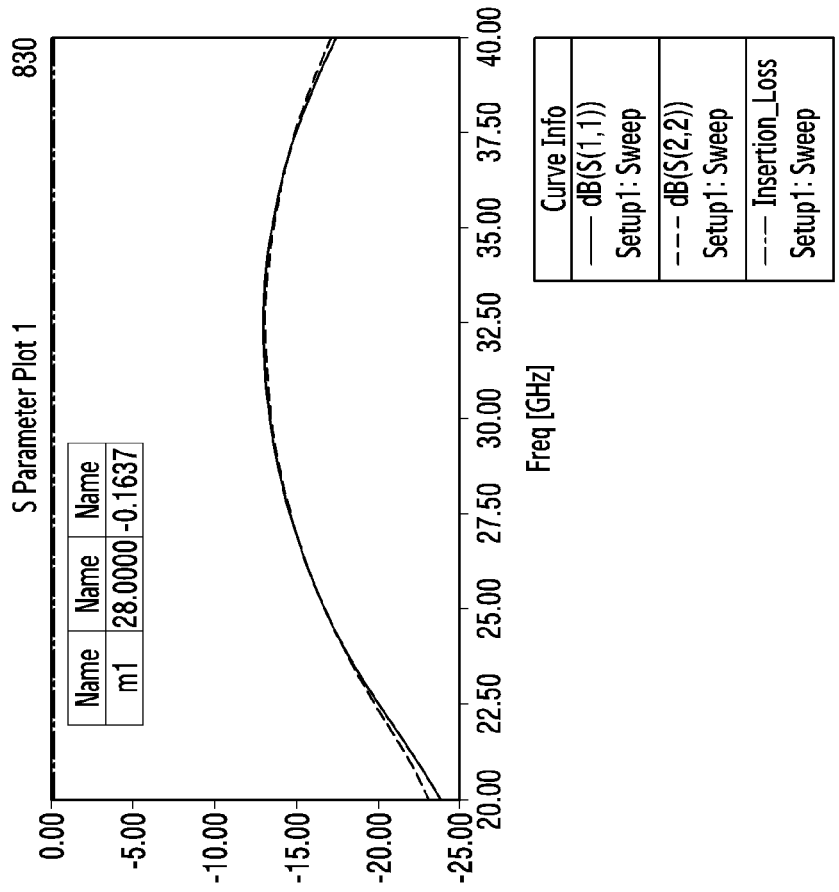
FIG. 8 shows an example of a performance according to an air-based feed structure according to an embodiment of the disclosure.
Figure 8:
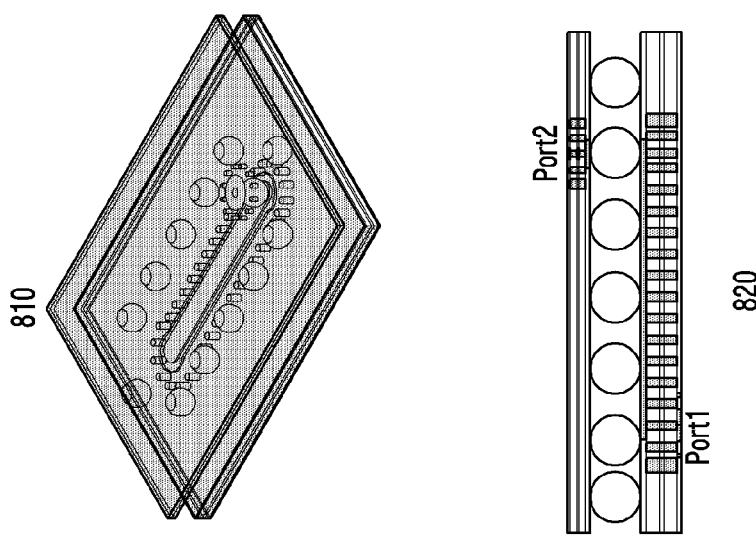

FIG. 8 shows an example of a performance according to an air-based feed structure according to an embodiment of the disclosure. As the feeding part is disposed adjacent to the antenna and the feeding line is formed in the air cavity, the dielectric loss is small and thus the feeding loss may be reduced.

Referring to FIG. 8, a stereoscopic view 810 shows the air-based feed structure. A front view 820 shows a section of the air-based feed structure. The air-based feed structure may include an RU board, an antenna board, and a grid array disposed between the RU board and the antenna board. According to an embodiment, the grid array may include a BGA. The BGA may include multiple balls.

According to embodiments of the disclosure, an antenna and a feeding line for transmitting and receiving an RF signal may be formed on an upper layer of the RU board. The RU board may use a hybrid process-type board using a high-density multi-layer substrate such as a high density interconnection (HDI) and multi-layer board (MLB). By way of example, a width of the feeding line may correspond to 400 um, a space may correspond to 100 um, and a roughness length may correspond to 1 um. Port 1 is electrically connected to port 2 through the feeding line and a ball of the BGA. For example, a size of the ball of the BGA may be about 0.5 mm, a length of a pad may correspond to 0.4 mm, and a pitch may correspond to 1 mm Meanwhile, a height of the ball of the BGA may be assumed as 0.4 mm due to melting at high temperature.

Referring to a diagram 830, the horizontal axis represents frequencies and the vertical axis represents S parameters (for example, S(1,1), S(2,2), and S(2,1)). S(2,1) is a pass coefficient and represents an insertion loss. The insertion loss of about 0.16 dB is confirmed in a 28 GHz band. The insertion loss of 0.16 dB may correspond to 0.035 dB/mm when converted to mm. This is a value that is reduced by about 50% compared to an existing line loss and it is confirmed that the feeding loss is reduced through the air-based feed structure according to embodiments of the disclosure.

Figure 9:
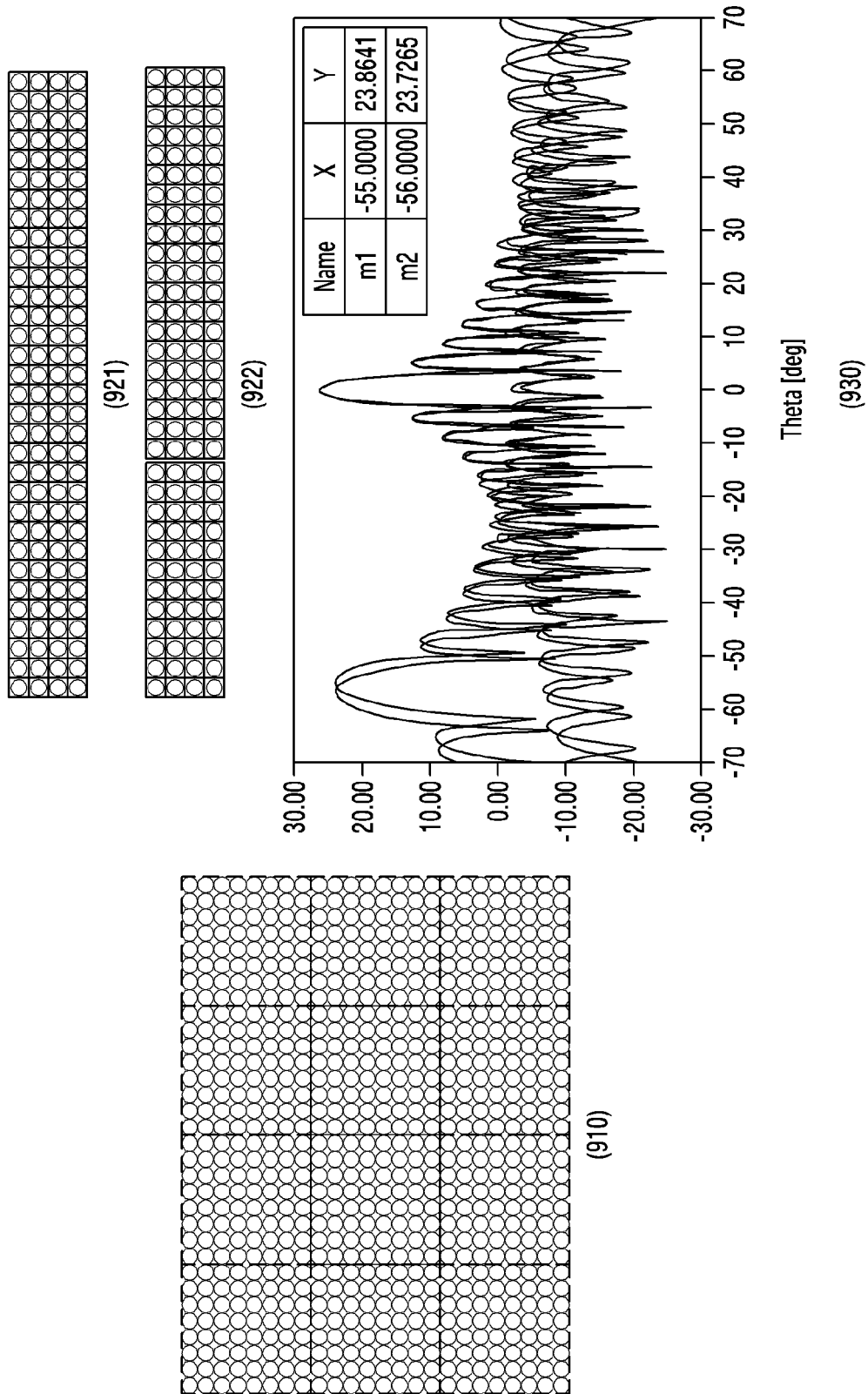
FIG. 9 shows an example of performance influence due to a mounting interval between units according to an embodiment of the disclosure.

FIG. 9 shows an example of performance influence due to a mounting interval between units according to an embodiment of the disclosure.

Referring to FIG. 9, an electronic device 910 may include 12 antenna units. Sixty four antenna elements may form one unit. The antenna unit may include antenna elements arranged in 8×8 form. According to an embodiment, the antenna unit may correspond to an antenna board. One antenna array may be formed by arranging an antenna board adjacent to an antenna board.

An SMT may be performed during a production process of the antenna board and the grid array according to embodiments of the disclosure. However, it is difficult to arrange an antenna board completely adjacent to an antenna board due to a manufacturing error (or production error). For manufacturing reasons, a regular interval is required between units. For example, a mounting interval of about 0.4 mm may be required. An interval between antenna elements is formed and a performance reason of a side lobe may occur.

The horizontal axis of a graph 930 represents angles based on a boresight direction (unit: degree) and the vertical axis represents gains (unit: dB). An antenna array 921 represents an arrangement having an interval between units with respect to an antenna unit having 4×16 form. An antenna array 922 represents an arrangement having no interval between units with respect to an antenna unit having 4×16 form. As shown in a graph 930, it is confirmed that a performance difference due to a side lobe is relatively lower compared with a performance gain due to feeding loss remedy of the disclosure.

FIGS. 10A, 10B, 10C, 10D, and 10E show examples of an electronic device include an air-based feed structure according to various embodiments of the disclosure. FIG. 10A to FIG. 10E show structures derived from an electronic device including the air-based feed structure shown in FIG. 6. The description of the stacking structure of the electronic device shown in FIG. 6 may be applied to embodiments to be described below in the same or similar manner.

Figure 10A:
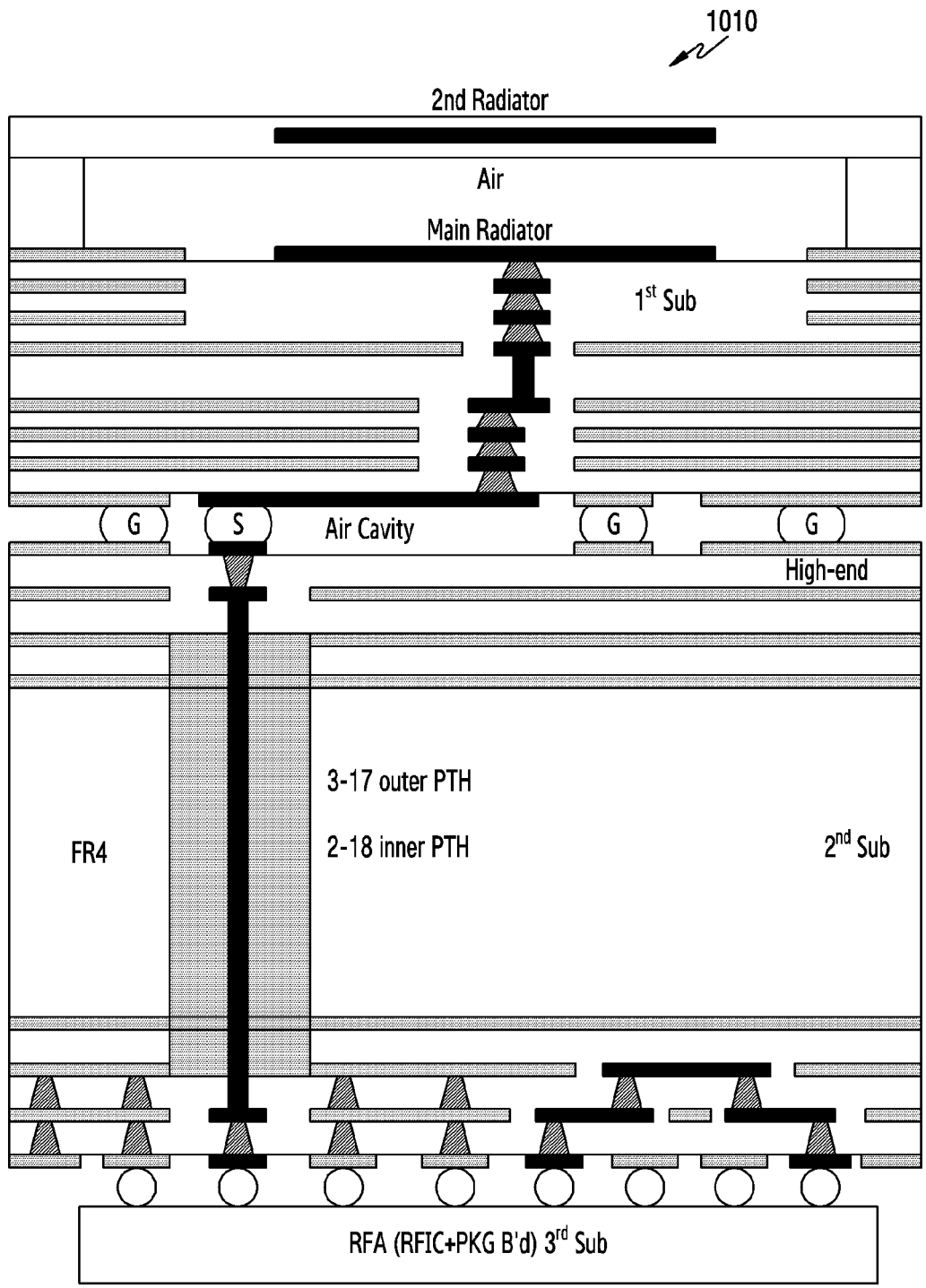
FIGS. 10A, 10B, 10C, 10D, and 10E show examples of an electronic device include an air-based feed structure according to various embodiments of the disclosure.

Referring to FIG. 10A, according to an embodiment, the electronic device 1010 may include a feeding line formed on a lower layer of an antenna board (i.e., the first PCB). Although the feeding line is formed on the lowermost layer of the antenna board unlike the upper layer of the RU board (i.e., the second PCB) in FIG. 6, the performance of the antenna may be improved because the feeding line is formed in the air cavity and the RU board and the antenna board are connected through the grid array.

Figure 10B:
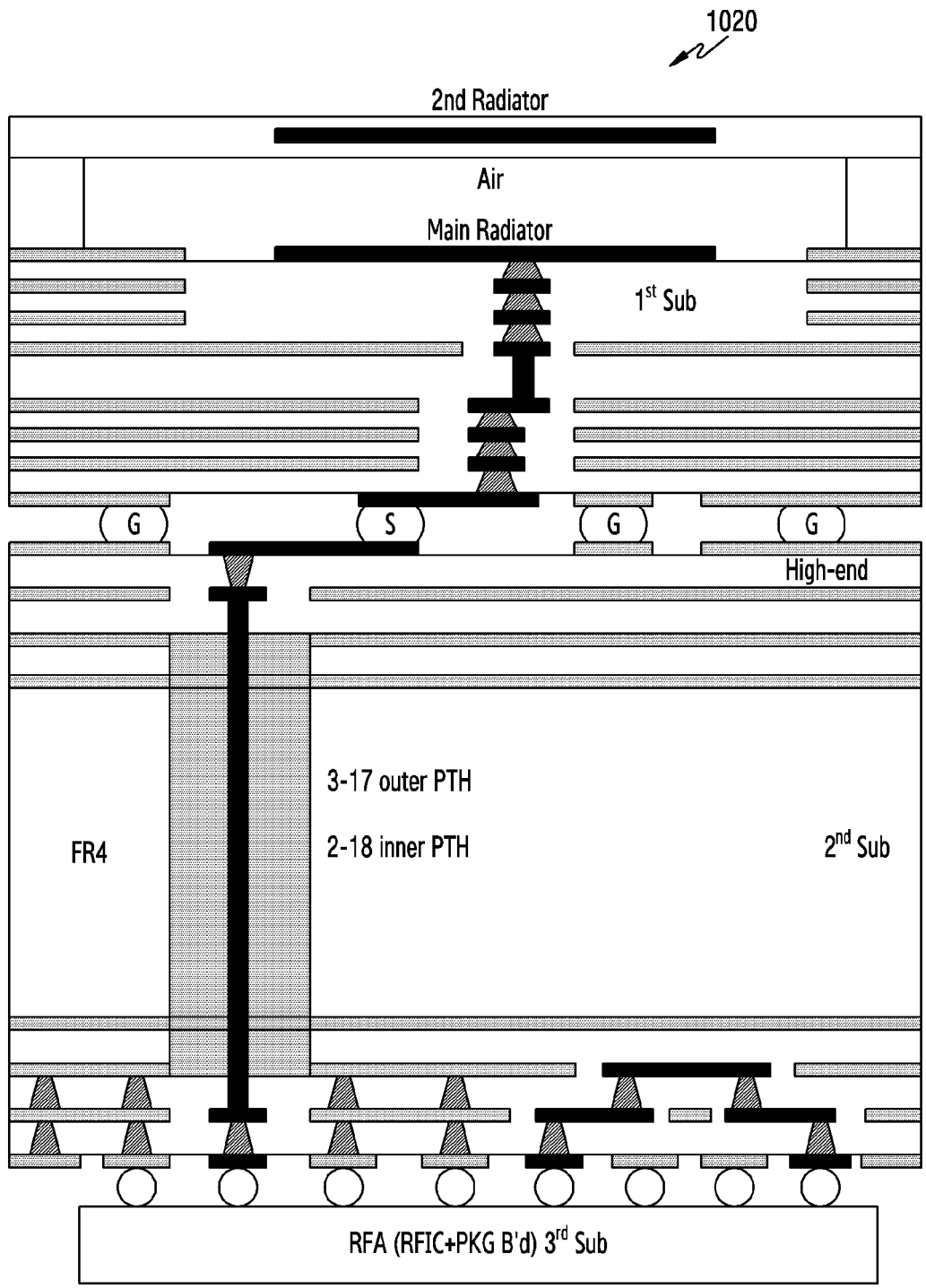

Referring to FIG. 10B, according to an embodiment, the electronic device 1020 may include a first feeding line formed on a lower layer of an antenna board (i.e., the first PCB) and a second feeding line formed on an upper layer of an RU board (i.e., the second PCB). The feeding line may be formed on the lowermost layer of the antenna board as well as the upper layer of the RU board (i.e., the second PCB). That is, the feeding line is formed in the air cavity and the RU board and the antenna board are connected through the grid array, and thus antenna performance improvement due to loss reduction may be achieved as in the previous embodiments.

Figure 10C:
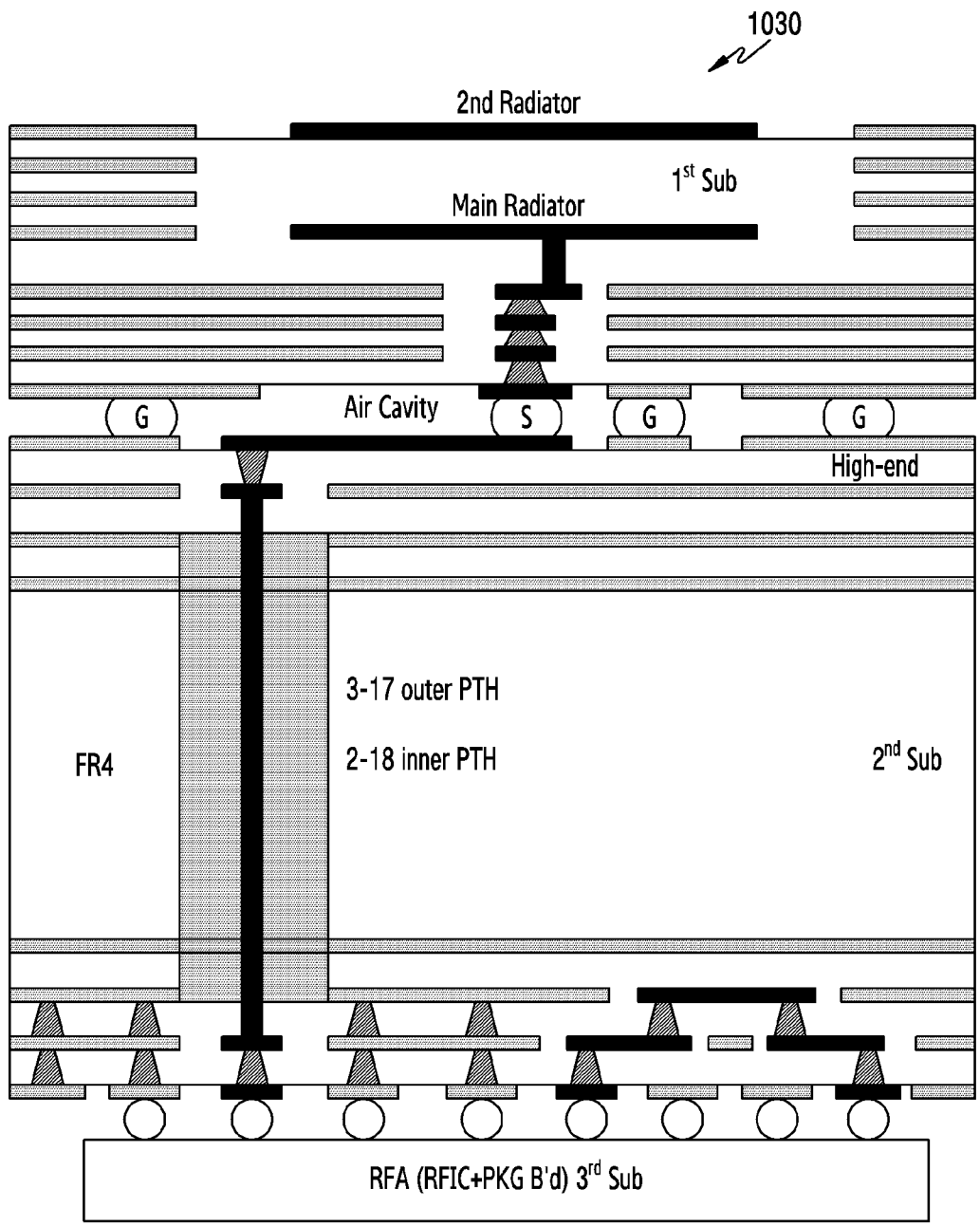

Referring to FIG. 10C, according to an embodiment, the electronic device 1030 may include an antenna part in which a first radiator is disposed in the antenna board and a second radiator is mounted on one surface of the antenna board without a cover. That is, embodiments of the disclosure may be applied to the air-based feed structure according to embodiments of the disclosure even in case that the coupling relation between the antenna board and the RU board is not the in-case FPCB antenna. In other words, in addition to the configuration shown in FIG. 10C, embodiments of the disclosure may be applied even to other types of antennas (for example, an endfire of a terminal or foldable device and a wide-aperture antenna) as long as the structure in which an antenna board and an RU board are coupled through a grid array. Furthermore, according to an embodiment, the coaxial PTH is described as a structure for transferring a signal from the RU board to the feeding line, but a general PTH may be possible.

Figure 10D:
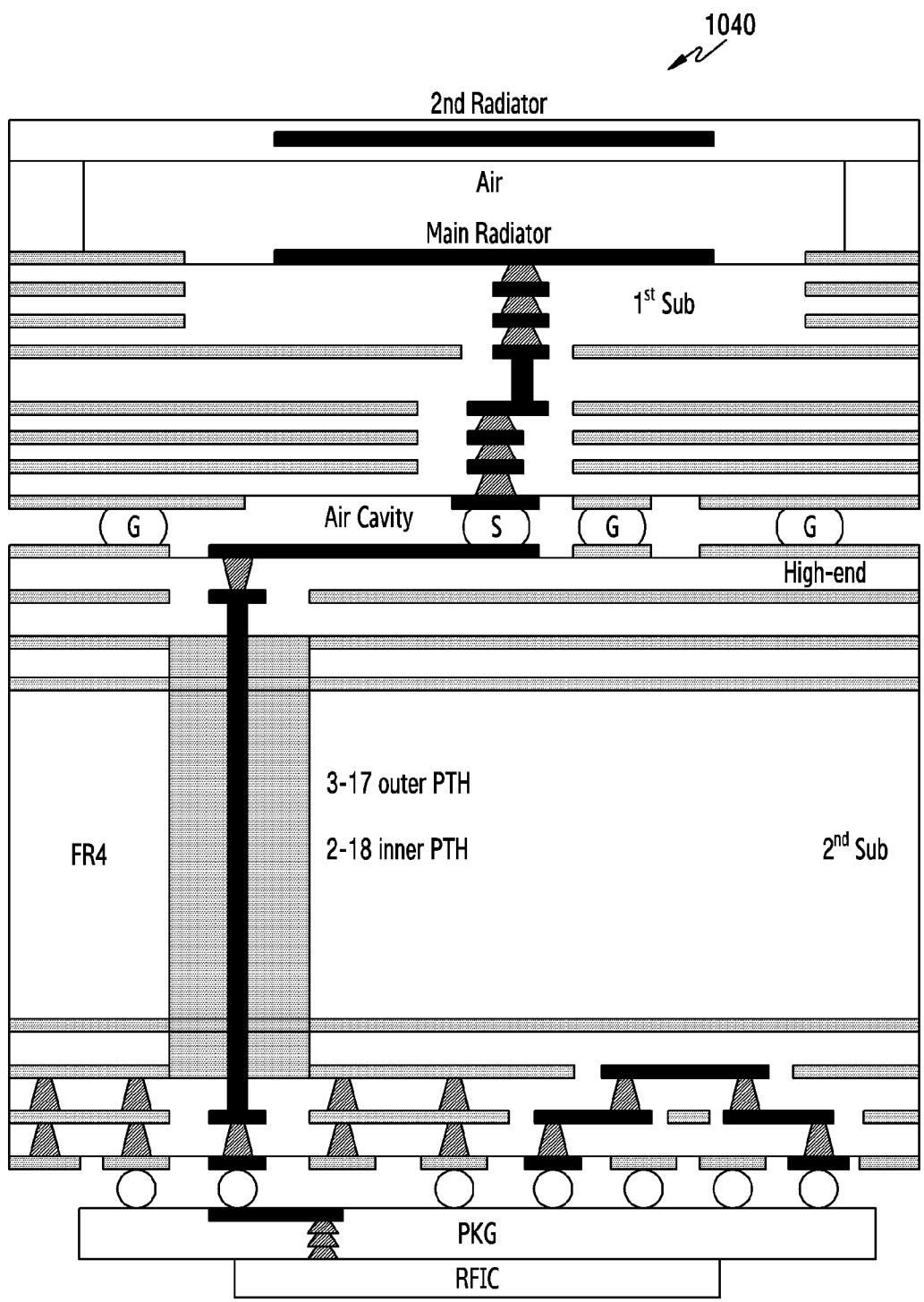

Referring to FIG. 10D, according to an embodiment, the electronic device 1040 may include an air-based feed structure applied between the second PCB as an RU board and a package board of an RFIC. That is, the air-based feed structure between the antenna board and the RU board shown in FIG. 6 to FIG. 9 may be applied between the RU board and the package board to which the RFIC is mounted in a similar manner According to an embodiment, the RFIC may be implemented as a system in package (SiP) form.

According to an embodiment, one surface (hereinafter, a first surface) of the package board may be coupled to the RU board. The package board and the RU board may be coupled through the grid array (for example, the BGA). The other surface (hereinafter, a second surface) of the package board may be coupled to the RFIC. A feeding line may be formed on the first surface of the package board. The feeding line may electrically connect the RFIC and the PTH of the RU board through a ball of the grid array.

Figure 10E:
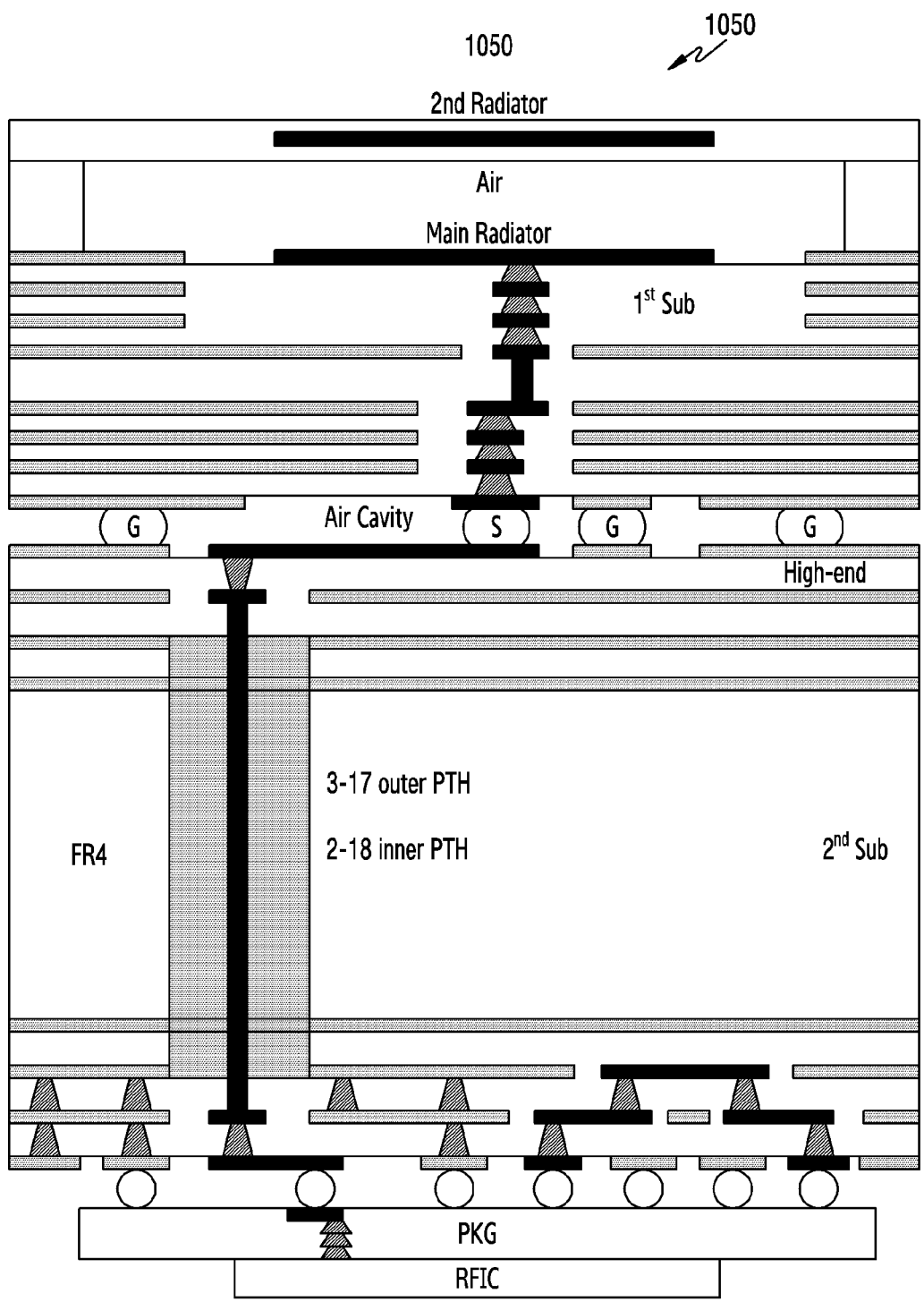

Referring to FIG. 10E, according to an embodiment, the electronic device 1050 may include an air-based feed structure applied between the second PCB as an RU board and a package board of an RFIC. According to an embodiment, the RFIC may be implemented as a system in package (SiP) form. According to an embodiment, one surface of the package board may be coupled to one surface (hereinafter, a first surface) of the RU board. The package board and the RU board may be coupled through the grid array (for example, the BGA). A feeding line may be formed on the first surface of the RU board. The feeding line may electrically connect the RFIC and the PTH of the RU board through a ball of the grid array.

In order to manufacture the RU module structure including the antenna board, the grid array, and the RU board according to embodiments of the disclosure, a reflow process may be performed in a state in which the grid array is coupled to the antenna board and the RU board. That is, the antenna board passes through an SMT line at a high temperature (about 260 degrees) in a state in which the antenna board is attached to the RU board (in other words, a mother board) by the BGA. A flexure property of a PCB may occur during the reflow process due to the high temperature. An arrangement of the grid array to minimize such flexure property of a PCB may be used in embodiments of the disclosure. According to an embodiment, the BGA (or a BGA module) disposed on the RU board of the disclosure may be positioned on the RU board according to ball arrangement and an interval between BGAs for minimizing the flexure property of a PCB.

Figure 11:
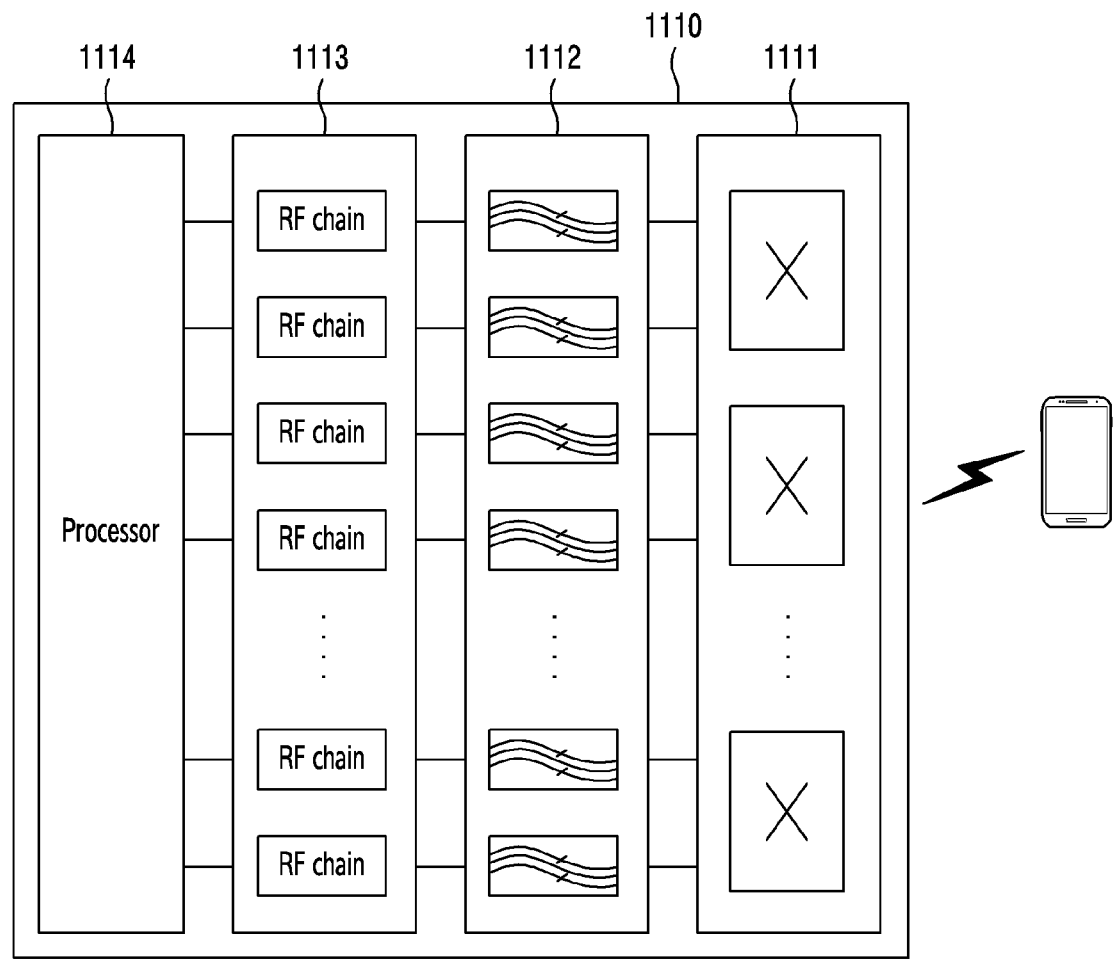
FIG. 11 shows a functional configuration of an electronic device including an air-based feed structure according to an embodiment of the disclosure.

FIG. 11 shows a functional configuration of an electronic device including an air-based feed structure according to an embodiment of the disclosure. The air-based feed structure represents a structure in which a feeding line is formed in an air layer formed between a board (i.e., the antenna board) on which a radiating antenna is disposed and a board (i.e., the RU board or the main board) on which RF components (for example, an RF signal line, a power amplifier, and a filter) are disposed. In case that the antenna board is mounted on the main board, the feeding line may be formed on at least one of the lowermost layer of the antenna board or the uppermost layer of the main board. The electronic device 1110 may correspond to one of the base station 110 or the terminal 120 in FIG. 1. According to an embodiment, an electronic device 1110 may correspond to a base station device configured to support mmWave communication (for example, frequency range 2 in 3GPP). The embodiments of the disclosure include the antenna structure mentioned with reference to FIG. 1 to FIG. 10E as well as the electronic device including the antenna structure. The electronic device 1110 may include an RF having an air-based feed structure.

Referring to FIG. 11, a functional configuration of the electronic device 1110 is shown. The electronic device 1110 may include an antenna part 1111, a power interface part 1112, a radio frequency (RF) processor 1113, and a processor 1114 (i.e., controller).

The antenna part 1111 may include multiple antennas. The antenna functions for transmitting or receiving a signal through a wireless channel. The antenna may include a radiator formed of a conductor or a conductive pattern formed on a substrate (for example, a PCB). The antenna may radiate an up-converted signal on a wireless channel or obtain a signal radiated by other devices. Each antenna may be referred to as an antenna element or an antenna component. In some embodiments, the antenna part 1111 may include an antenna array in which multiple antenna elements form an array. The antenna part 1111 may be electrically connected to the power interface part 1112 through RF signal lines. The antenna part 1111 may be mounted to a PCB including multiple antenna elements. According to an embodiment, the antenna part 1111 may be mounted on a FPCB. The antenna part 1111 may provide a received signal to the power interface part 1112 or radiate a signal provided by the power interface part 1112 into the air.

The power interface part 1112 may include a module and parts. The power interface part 1112 may include one or more IFs. The power interface part 1112 may include one or more LOs. The power interface part 1112 may include one or more LDOs. The power interface part 1112 may include one or more DC/DC converters. The power interface part 1112 may include one or more DFEs. The power interface part 1112 may include one or more FPGAs. The power interface part 1112 may include one or more connectors. The power interface part 1112 may include a power supplier.

According to another embodiment, the power interface part 1112 may include areas for one or more antenna modules mounted thereon. For example, the power interface part 1112 may include multiple antenna modules for supporting MIMO communication. An antenna module according to the antenna part 1111 may be mounted to the corresponding areas. According to yet another embodiment, the power interface part 1112 may include a filter. The filter may perform filtering for transferring a signal of a desired frequency. The power interface part 1112 may include a filter. The filter may a function to selectively identify a frequency by generating a resonance. The power interface part 1112 may include at least one of a band pass filter, a low pass filter, a high pass filter, or a band reject filter. That is, the power interface part 1112 may include RF circuits for obtaining signals in a frequency band for transmission or a frequency band for reception. The power interface part 1112 according to various embodiments may electrically connect the antenna part 1111 and the RF processor 1113.

The RF processor 1113 may include multiple RF processing chains. The RF chain may include multiple RF elements. The RF elements may include an amplifier, a mixer, an oscillator, a DAC, an ADC, and the like. According to an embodiment, the RF processing chain may correspond to an RFIC. For example, the RF processor 1113 may include an up converter for up-converting a digital signal into a transmission frequency and a digital-to-analog converter for converting an up-converted digital signal into an analog RF transmission signal. The up converter and the DAC form a portion of a transmission path. The transmission path may further include a power amplifier (PA) or a coupler (or combiner). In addition, for example, the RF processor 1113 may include an analog-to-digital converter (ADC) for converting an analog RF reception signal into a digital reception signal and a down converter for down-converting a digital reception signal into a digital reception signal in a ground band. The ADC and the down converter form a portion of a reception path. The reception path may further include a low-noise amplifier (LNA) or a coupler (or divider). RF components of the RF processor may be implemented on a PCB. The electronic device 1110 may include a structure in which the antenna part 1111, the power interface part 1112, and the RF processor 1113 are sequentially stacked. Antennas, RF components of the power interface part, and the RFICs may be implemented on a separate PCB and filters between PCBs may be repeatedly coupled to each other to form multiple layers.

The processor 1114 may control general operations of the electronic device 1110. The processor 1114 may include various modules for performing communication. The processor 1114 may include at least one processor such as a modem. The processor 1114 may include modules for digital signal processing. For example, the processor 1114 may include a modem. When transmitting data, the processor 1114 may generate complex symbols by coding and modulating a transmission bit stream. In addition, for example, when data is received, the processor 1114 may restore a bit stream by demodulating and decoding a baseband signal. The processor 1114 may perform functions of a protocol stack required by a communication standard.

Referring to FIG. 11, a functional configuration of the electronic device 1110 is described as equipment for which the antenna structure of the disclosure may be utilized. However, the example shown in FIG. 11 is merely a configuration for the utilization of the RF filter structure according to various embodiments of the disclosure described through FIGS. 1, 2A, 2B, 3A, 3B, 4 to 9, and 10A to 10E, and the embodiments of the disclosure are not limited to the components of the equipment shown in FIG. 11. Accordingly, an antenna module including an antenna structure, other type of communication equipment, and an antenna structure itself may also be understood as embodiments of the disclosure.

According to embodiments of the disclosure, a radio unit (RU) module may include: multiple antennas; a first printed circuit board (PCB) on which the multiple antenna are arranged; a second PCB including a power interface; and a grid array configured to couple a first surface of the first PCB and a first surface of the second PCB, wherein the size of the first PCB is smaller than that of the second PCB, and a feeding line configured to transfer a signal to at least one antenna among the multiple antennas is formed on at least one of a layer corresponding to the first surface of the first PCB or a layer corresponding to the first surface of the second PCB.

According to one embodiment, in the RU module, the first PCB may include first multiple layers, the layer corresponding to the first surface of the first PCB may be a layer closest to the second PCB among the first multiple layers, the second PCB may include second multiple layers, and the layer corresponding to the first surface of the second PCB may be a layer closest to the first PCB among the second multiple layers.

According to an embodiment, the feeding line may include a first feeding line formed on the layer corresponding to the first surface of the first PCB and a second feeding line formed on the layer corresponding to the first surface of the second PCB, and the first feeding line and the second feeding line may be in contact with each other through a ball of the grid array.

According to an embodiment, the feeding line may be formed in an air cavity between the first PCB and the second PCB.

According to an embodiment, the RU module may support a dual-band, the RU module may include multiple antenna arrays configured to support two-transmit two-receive (2T2R) or four-transmit four-receive (4T4R) in each band, and each of multiple first PCBs corresponding to one antenna array among the multiple antenna arrays may be spaced a predetermined distance away from an adjacent PCB.

According to embodiment, the antenna array may correspond to one reception path or one transmission path of a digital terminal.

According to embodiment, the grid array may be a ball grid array (BGA) module.

According to embodiment, the RU module may further include a third PCB including components configured to process an RF signal, wherein in the RU module, a first surface of the third PCB may be coupled to a second surface opposite to the first surface of the second PCB through the grid array.

According to an embodiment, in the RU module, an RFIC may be mounted on a second surface opposite to the first surface of the third PCB, wherein a feeding line configured to transfer a signal to the RFIC or receive a signal from the RFIC may be formed on at least one of a layer corresponding to the second surface of the second PCB or a layer corresponding to a first surface of the package board.

According to embodiment, the RU module may be coupled to a cover including a shield can configured to block electromagnetic waves.

According to embodiments of the disclosure, an electronic device may include: multiple antenna arrays; multiple first printed circuit board (PCB) sets corresponding to the multiple antenna arrays; a second PCB including a power interface; and a grid array configured to couple a first surface of each of first PCBs of the first PCB sets corresponding to an antenna array and a first surface of the second PCB, wherein the size of each of the first PCBs is smaller than that of the second PCB, and a feeding line configured to transfer a signal to an antenna element is formed on at least one of a layer corresponding to the first surface of each of the first PCBs or a layer corresponding to the first surface of the second PCB.

According to one embodiment, each of the first PCBs may include first multiple layers wherein the layer corresponding to the first surface of each of the first PCBs may be a layer closest to the second PCB among the first multiple layers, and the second PCB may include second multiple layers wherein the layer corresponding to the first surface of the second PCB may be a layer closest to the first PCBs among the second multiple layers.

According to an embodiment, the feeding line may include a first feeding line formed on the layer corresponding to the first surface of each of the first PCBs and a second feeding line formed on the layer corresponding to the first surface of the second PCB, wherein the first feeding line and the second feeding line may be in contact with each other through a ball of the grid array.

According to an embodiment, the feeding line may be formed in an air cavity between each of the first PCBs and the second PCB.

According to an embodiment, the electronic device may support a dual-band, the multiple antenna arrays may be configured to support two-transmit two-receive (2T2R) or four-transmit four-receive (4T4R) in each band, and each of the first PCBs may be spaced a predetermined distance away from an adjacent PCB.

According to an embodiment, each of the antenna arrays may correspond to one reception path or one transmission path of a digital terminal.

According to an embodiment, the grid array may be a ball grid array (BGA) module.

According to an embodiment, the electronic device may further include a third PCB including components configured to process an RF signal, wherein a first surface of the third PCB may be coupled to a second surface opposite to the first surface of the second PCB through the grid array.

According to an embodiment, an RFIC may be mounted on a second surface opposite to the first surface of the third PCB, wherein a feeding line configured to transfer a signal to the RFIC or receive a signal from the RFIC may be formed on at least one of a layer corresponding to the second surface of the second PCB or a layer corresponding to a first surface of the package board.

According to an embodiment, the electronic device may further include a cover including a shield can configured to block electromagnetic waves.

The methods according to various embodiments described in the claims or the specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of them may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device via an external port. Further, a separate storage device on the communication network may access a portable electronic device.

In the above-described detailed embodiments of the disclosure, an element included in the disclosure is expressed in the singular or the plural according to presented detailed embodiments. However, the singular form or plural form is selected appropriately to the presented situation for the convenience of description, and the disclosure is not limited by elements expressed in the singular or the plural. Therefore, either an element expressed in the plural may also include a single element or an element expressed in the singular may also include multiple elements.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. A radio unit (RU) module comprising:
a plurality of antennas;
a first printed circuit board (PCB) for the plurality of antennas, wherein the first PCB includes a first feeding structure electrically connected with at least one antenna among the plurality of antennas;
a radio frequency integrated circuit (RFIC);
a second PCB for the RFIC, wherein the second PCB includes a second feeding structure electrically connected with the RFIC; and
a grid array disposed between the first PCB and the second PCB and including a first ball, a second ball and a third ball,
wherein the first ball is disposed between the second ball and the third ball and electrically connects the first feeding structure and the second feeding structure,
wherein each of the second ball and the third ball electrically connects a ground layer of the first PCB and a ground layer of the second PCB, and
wherein the second feeding structure is configured to transfer a signal from the RFIC to the first feeding structure via the first ball.

2. The RU module of claim 1,
wherein the first PCB comprises a plurality of first layers,
wherein a layer corresponding to a first conductor is a layer closest to the second PCB among the plurality of first layers,
wherein the second PCB comprises a plurality of second layers,
wherein a layer corresponding to a second conductor is a layer closest to the first PCB among the plurality of second layers, and
wherein the first ball is in contact with the first conductor and the second conductor for electrically connecting the first feeding structure and the second feeding structure.

3. The RU module of claim 2,
wherein the first feeding structure is in contact with the first conductor and the second feeding structure is in contact with the second conductor.

4. The RU module of claim 2, further comprising:
a third PCB,
wherein a first surface of the third PCB is coupled to a second surface of the second PCB through a grid array.

5. The RU module of claim 4,
wherein the RFIC is mounted on the third PCB, and
wherein the signal is transferred from the RFIC to the at least one antenna via the second feeding structure, the second conductor, the first ball, the first conductor and the first feeding structure.

6. The RU module of claim 1, wherein an air cavity is disposed between the first PCB and the second PCB.

7. The RU module of claim 1,
wherein the RU module supports a dual-band,
wherein the RU module comprises a plurality of antenna arrays configured to support two-transmit two-receive (2T2R) or four-transmit four-receive (4T4R) in each band of the dual-band, and
wherein each of a plurality of first PCBs corresponds to one antenna array among the plurality of antenna arrays, and is spaced a predetermined distance away from an adjacent PCB.

8. The RU module of claim 7, wherein each of the plurality of antenna arrays corresponds to one reception path or one transmission path of a digital terminal.

9. The RU module of claim 1, wherein the grid array includes a ball grid array (BGA) module.

10. The RU module of claim 1, wherein the RU module is coupled to a cover.

11. The RU module of claim 1, wherein the second PCB is a high density interconnection (HDI) and multi-layer board (MLB).

12. The RU module of claim 1, further comprising:
a plurality of second antennas disposed on the first PCB.

13. The RU module of claim 1, wherein the ground layer of the first PCB and the ground layer of the second PCB are for the plurality of antennas.

14. A base station comprising:
a plurality of antenna arrays including a plurality of antennas;
a plurality of first printed circuit boards (PCBs) corresponding to the plurality of antenna arrays, wherein the plurality of first PCBs include a first PCB for the plurality of antennas and wherein the first PCB includes a first feeding structure electrically connected with at least one antenna among the plurality of antennas;
a radio frequency integrated circuit (RFIC);
a second PCB for the RFIC, wherein the second PCB includes a second feeding structure electrically connected with the RFIC; and
a grid array disposed between the first PCB and the second PCB and including a first ball, a second ball and a third ball,
wherein the first ball is disposed between the second ball and the third ball and electrically connects the first feeding structure and the second feeding structure,
wherein each of the second ball and the third ball electrically connects a ground layer of the first PCB and a ground layer of the second PCB, and
wherein the second feeding structure is configured to transfer a signal from the RFIC to the first feeding structure via the first ball.

15. The base station of claim 14,
wherein the first PCB comprises a plurality of first layers,
wherein a layer corresponding to a first conductor is a layer closest to the second PCB among the plurality of first layers,
wherein the second PCB comprises a plurality of second layers,
wherein a layer corresponding to a second conductor is a layer closest to the first PCB among the plurality of second layers, and
wherein the first ball is in contact with the first conductor and the second conductor for electrically connecting the first feeding structure and the second feeding structure.

16. The base station of claim 15,
wherein the first feeding structure is in contact with the first conductor and the second feeding structure is in contact with the second conductor.

17. The base station of claim 14, wherein an air cavity is disposed between each of the plurality of first PCBs and the second PCB.

18. The base station of claim 14,
wherein the base station supports a dual-band,
wherein the plurality of antenna arrays are configured to support two-transmit two-receive (2T2R) or four-transmit four-receive (4T4R) in each band, and
wherein each of the plurality of first PCBs is spaced a predetermined distance away from an adjacent PCB.

19. The base station of claim 18, wherein each of the plurality of antenna arrays corresponds to one reception path or one transmission path of a digital terminal.

20. The base station of claim 18, wherein the grid array includes a ball grid array (BGA) module.

\* \* \* \* \*